US012672514B2

(12) United States Patent
Schulze et al.

(10) Patent No.: US 12,672,514 B2
(45) Date of Patent: *Jun. 30, 2026

(54) INTEGRATED SUBSTRATE MEASUREMENT SYSTEM

(71) Applicant: Applied Materials, Inc., Santa Clara, CA (US)

(72) Inventors: Patricia Schulze, Giddings, TX (US); Gregory John Freeman, Austin, TX (US); Michael Kutney, Santa Clara, CA (US); Arunkumar Ramachandraiah, Bengaluru (IN); Chih Chung Chou, San Jose, CA (US); Zhaozhao Zhu, Milpitas, CA (US); Ozkan Celik, Cedar Park, TX (US)

(73) Assignee: Applied Materials, Inc., Santa Clara, CA (US)

( * ) Notice: Subject to any disclaimer, the term of this patent is extended or adjusted under 35 U.S.C. 154(b) by 17 days.

This patent is subject to a terminal disclaimer.

(21) Appl. No.: 18/747,417

(22) Filed: Jun. 18, 2024

(65) Prior Publication Data

US 2024/0339347 A1 Oct. 10, 2024

Related U.S. Application Data

(63) Continuation of application No. 17/584,322, filed on Jan. 25, 2022, now Pat. No. 12,148,647.

(51) Int. Cl.
*H10P 72/50* (2026.01)
*G01B 11/24* (2006.01)
(Continued)

(52) U.S. Cl.
CPC .............. *H10P 72/53* (2026.01); *G01B 11/24* (2013.01); *H10P 72/72* (2026.01); *H10P 72/7606* (2026.01); *G01B 2210/56* (2013.01)

(58) Field of Classification Search
CPC ...... H10P 72/53; H10P 72/72; H10P 72/7606; H10P 72/0606; G01B 11/24;
(Continued)

(56) References Cited

U.S. PATENT DOCUMENTS 5,238,354 A 8/1993 Volovich
5,427,878 A 6/1995 Corliss
(Continued)

FOREIGN PATENT DOCUMENTS

CN 305860013 6/2020
CN 306604020 6/2021
(Continued)

OTHER PUBLICATIONS

"High Performance Air Bearing Stage Capabilities & Solutions", MKS Newport, Jan. 2011, pp. 1-24.
(Continued)

*Primary Examiner* — Md M Rahman
(74) *Attorney, Agent, or Firm* — Lowenstein Sandler LLP

(57) ABSTRACT

An optical measurement device comprises a substrate holder to secure a substrate, a plurality of actuators to move the substrate holder relative to a plurality of axes, a first sensor to generate one or more first measurements or images of a first plurality of target positions on the substrate, and a second sensor to generate one or more second measurements of a second plurality of target positions on the substrate. The optical measurement device further comprises a plate, wherein the substrate holder, the plurality of actuators, the first sensor and the second sensor are each mounted to the plate, and wherein the plate provides vibration isolation from a factory interface to which the optical measurement device mounts. The optical measurement device further comprises a processing device that executes instructions to
(Continued)

control the plurality of actuators and process the first measurements or images and the second measurements.

16 Claims, 10 Drawing Sheets

(51) Int. Cl.
    *H10P 72/72*       (2026.01)
    *H10P 72/76*       (2026.01)

(58) Field of Classification Search
    CPC .... G01B 2210/56; G01B 11/03; G01B 11/06;
                                             G01N 21/9501
    USPC ........................................................ 356/601
    See application file for complete search history.

(56) References Cited

U.S. PATENT DOCUMENTS

| | | | |
|---|---|---|---|
| 5,452,521 A | 9/1995 | Niewmierzycki | |
| 6,162,008 A | 12/2000 | Perkins et al. | |
| 6,304,999 B1 | 10/2001 | Toprac et al. | |
| 6,331,890 B1 | 12/2001 | Marumo et al. | |
| 6,625,497 B2 | 9/2003 | Fairbairn et al. | |
| 6,708,075 B2 | 3/2004 | Sonderman et al. | |
| 6,721,045 B1 * | 4/2004 | Hunter | G01N 21/94 |
| | | | 356/237.4 |
| D605,652 S | 12/2009 | Plaisted et al. | |
| 7,642,102 B2 | 1/2010 | Funk et al. | |
| D618,695 S | 6/2010 | Bennett et al. | |
| 7,904,275 B2 | 3/2011 | Sugimoto | |
| 8,072,578 B2 | 12/2011 | Yasuda et al. | |
| 8,179,530 B2 | 5/2012 | Levy et al. | |
| 8,257,546 B2 | 9/2012 | Davis et al. | |
| D756,371 S | 5/2016 | Bertnick et al. | |
| 9,347,879 B2 | 5/2016 | Adel et al. | |
| D766,940 S | 9/2016 | Napper et al. | |
| D767,612 S | 9/2016 | Hemsley | |
| D781,300 S | 3/2017 | Rhodes et al. | |
| D819,066 S | 5/2018 | Anderson et al. | |
| D829,749 S | 10/2018 | Kang et al. | |
| 10,262,910 B2 | 4/2019 | Feng et al. | |
| 10,388,549 B2 | 8/2019 | Paul et al. | |
| 10,490,462 B2 | 11/2019 | Pandev et al. | |
| D874,481 S | 2/2020 | Kumar et al. | |
| D884,015 S | 5/2020 | Walfridsson et al. | |
| D890,799 S | 7/2020 | Heffernan et al. | |
| 10,727,057 B2 | 7/2020 | Clark et al. | |
| 10,727,142 B2 | 7/2020 | Gellineau et al. | |
| D892,143 S | 8/2020 | Dascola et al. | |
| 10,886,155 B2 | 1/2021 | Zhu et al. | |
| D914,703 S | 3/2021 | Capela et al. | |
| 11,029,673 B2 | 6/2021 | Honda et al. | |
| D928,818 S | 8/2021 | Yuk et al. | |
| D937,861 S | 12/2021 | Torrance | |
| D938,465 S | 12/2021 | Shen et al. | |
| D940,169 S | 1/2022 | Boutros et al. | |
| D941,851 S | 1/2022 | Anderson et al. | |
| D948,543 S | 4/2022 | Friedland et al. | |
| 2001/0046049 A1 | 11/2001 | Aspnes et al. | |
| 2002/0018217 A1 | 2/2002 | Weber-Grabau et al. | |
| 2003/0020889 A1 | 1/2003 | Takahashi | |
| 2005/0041255 A1 | 2/2005 | Hyun et al. | |
| 2005/0187649 A1 | 8/2005 | Funk et al. | |
| 2007/0134829 A1 | 6/2007 | Wilke et al. | |
| 2008/0013089 A1 | 1/2008 | Ishii et al. | |
| 2009/0132078 A1 | 5/2009 | Sakano | |
| 2010/0332011 A1 | 12/2010 | Venugopal et al. | |
| 2011/0172952 A1 | 7/2011 | Ummethala et al. | |
| 2011/0232569 A1 | 9/2011 | Olgado | |
| 2012/0285621 A1 | 11/2012 | Tan | |
| 2013/0059403 A1 | 3/2013 | Lee et al. | |
| 2015/0004721 A1 | 1/2015 | Akimoto et al. | |
| 2016/0077025 A1 | 3/2016 | Zhang et al. | |
| 2016/0313658 A1 | 10/2016 | Marciano et al. | |

| | | |
|---|---|---|
| 2016/0341544 A1 | 11/2016 | Foad |
| 2017/0038201 A1 | 2/2017 | Bozdog et al. |
| 2017/0213750 A1 | 7/2017 | Khaja et al. |
| 2018/0090352 A1 | 3/2018 | Sotoku et al. |
| 2018/0150052 A1 | 5/2018 | Cherian |
| 2019/0064751 A1 | 2/2019 | Ohmori et al. |
| 2019/0121928 A1 | 4/2019 | Wu et al. |
| 2019/0147127 A1 | 5/2019 | Su et al. |
| 2019/0286075 A1 | 9/2019 | Yennie et al. |
| 2019/0347527 A1 | 11/2019 | Bhaviripudi et al. |
| 2020/0050180 A1 | 2/2020 | Kou et al. |
| 2020/0083070 A1 | 3/2020 | Clark et al. |
| 2020/0083080 A1 | 3/2020 | Clark et al. |
| 2020/0110341 A1 | 4/2020 | Mossavat et al. |
| 2020/0110390 A1 | 4/2020 | Banna |
| 2020/0243359 A1 | 7/2020 | Hao et al. |
| 2021/0012482 A1 | 1/2021 | Yoshida et al. |
| 2021/0166121 A1 | 6/2021 | Tsutsui |
| 2022/0026817 A1 | 1/2022 | Ummethala et al. |
| 2022/0028716 A1 | 1/2022 | Ummethala et al. |
| 2022/0066411 A1 | 3/2022 | Ummethala et al. |
| 2022/0111529 A1 | 4/2022 | Pehlivan et al. |
| 2022/0165593 A1 | 5/2022 | Panda et al. |

FOREIGN PATENT DOCUMENTS

| | | |
|---|---|---|
| JP | 3422799 B2 | 6/2003 |
| JP | 2003524748 A | 8/2003 |
| JP | 2018037559 A | 3/2018 |
| JP | 1644619 S | 11/2019 |
| JP | 1651220 S | 1/2020 |
| JP | 2020004817 A | 1/2020 |
| JP | 1659894 S | 5/2020 |
| JP | 1664109 S | 7/2020 |
| JP | 2021005101 A | 1/2021 |
| JP | 2021015850 A | 2/2021 |
| KR | 20090095837 A | 9/2009 |
| KR | 20110014916 A | 2/2011 |
| KR | 101910268 B1 | 10/2018 |
| KR | 20210136070 A | 11/2021 |
| TW | 201841219 A | 11/2018 |
| TW | 202006869 A | 2/2020 |
| WO | 0229393 A2 | 4/2002 |
| WO | 2012099907 A1 | 7/2012 |
| WO | 2019200015 A1 | 10/2019 |
| WO | 2020094325 A1 | 5/2020 |
| WO | 2021021501 A1 | 2/2021 |
| WO | 2021022291 A1 | 2/2021 |
| WO | 2021061541 A1 | 4/2021 |
| WO | 2021067239 A1 | 4/2021 |

OTHER PUBLICATIONS

Allen R.L., et al., "Application of Neural Networks to Plasma Etch End Point Detection" Journal of Vacuum Science Technology B: Microelectronics and Nanometer Structures Processing, Measurement and Phenomena, 1996, vol. 14 (1), pp. 498-503.

International Search Report and Written Opinion for International Application No. PCT/US2021/042639, mailed Nov. 11, 2021, 10 Pages.

International Search Report and Written Opinion for International Application No. PCT/US2021/042643, mailed Nov. 11, 2021, 9 pages.

International Search Report and Written Opinion for International Application No. PCT/US2021/042646, mailed Nov. 2, 2021, 10 Pages.

International Search Report and Written Opinion for International Application No. PCT/US2021/048061, mailed Dec. 17, 2021, 9 Pages.

International Search Report and Written Opinion for International Application No. PCT/US2022/050482, mailed Mar. 24, 2023, 12 Pages.

Notice of Allowance for U.S. Appl. No. 17/584,322, mailed Mar. 15, 2024, 15 Pages.

Synopsys: "Production-Centric Yield Management for Wafer Manufacturing" Synopsys, Jan. 5, 2018, 2 Pages, [Retrieved on Jan. 6,

(56)         References Cited

OTHER PUBLICATIONS

2022] Retrieved from URL: https://www.synopsys.com/content/dam/synopsys/silicon/datasheets/odyssey-ds.pdf.
Taiwan Search Report for Taiwan Application No. 110300382, mailed Sep. 27, 2021, 7 Pages.

* cited by examiner

300

$R_s$ Substrate Support $R_r$ reflectometer $R_c$ camera $x$

Substrate Support $\theta_s$ $x_{c/r}$

Camera /Refelctometer $\theta_{c/r}$ $y$ $y_{c/r}$

Notch Down Nominal

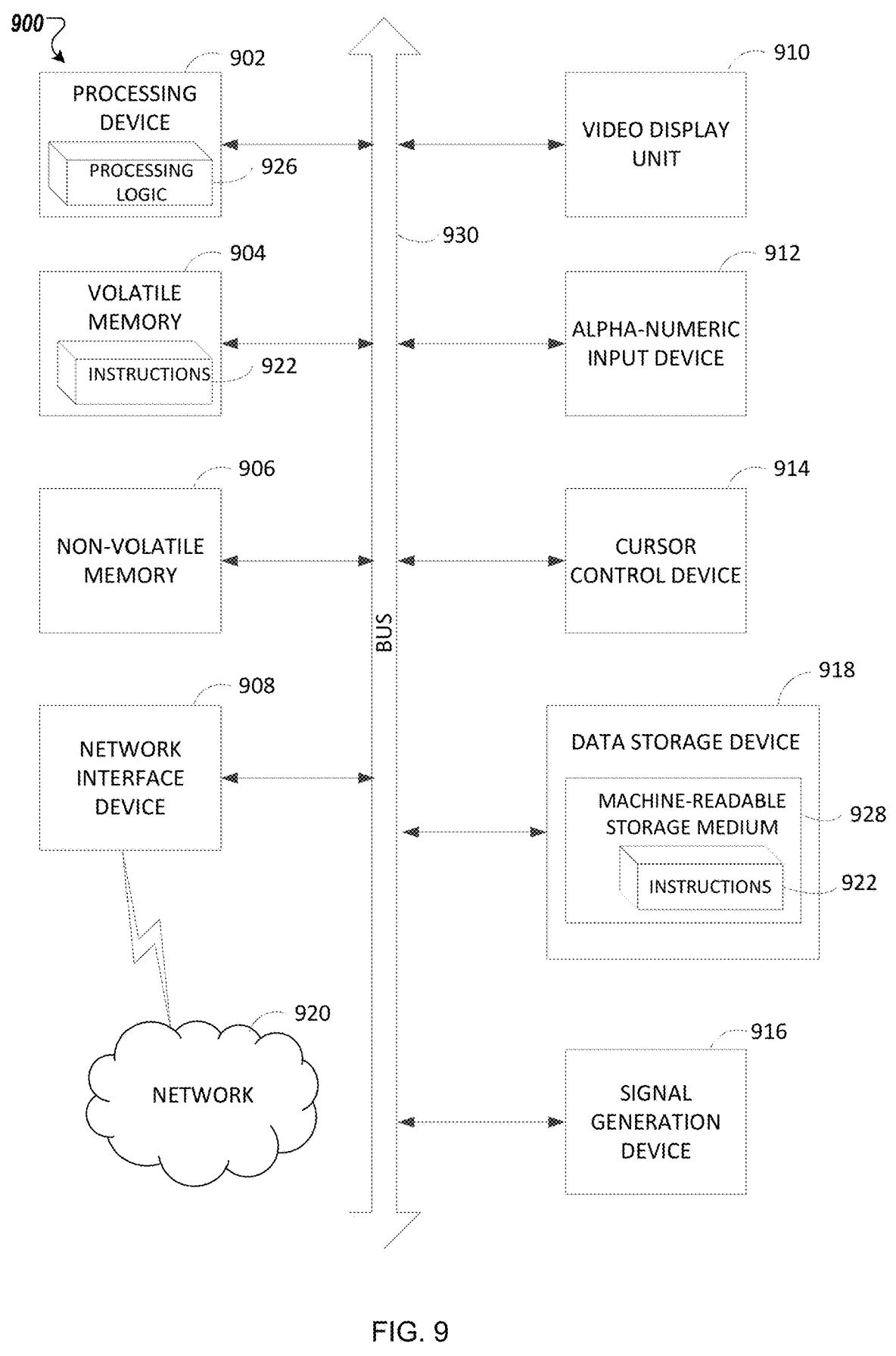

900

902
PROCESSING DEVICE

926
PROCESSING LOGIC

904
VOLATILE MEMORY

922
INSTRUCTIONS

906
NON-VOLATILE MEMORY

908
NETWORK INTERFACE DEVICE

930

BUS

910
VIDEO DISPLAY UNIT

912
ALPHA-NUMERIC INPUT DEVICE

914
CURSOR CONTROL DEVICE

918
DATA STORAGE DEVICE

928
MACHINE-READABLE STORAGE MEDIUM

922
INSTRUCTIONS

920
NETWORK

916
SIGNAL GENERATION DEVICE

FIG. 9

INTEGRATED SUBSTRATE MEASUREMENT SYSTEM

RELATED APPLICATIONS

This application is a continuation of U.S. application Ser. No. 17/584,322, filed Jan. 25, 2022, which is incorporated by reference.

TECHNICAL FIELD

Some embodiments of the disclosure relate, in general, to systems and methods for performing reflectometry measurements, imaging and/or other measurements, and to an integrated substrate measurement system, which may include a reflectometer and/or imager.

BACKGROUND

Manufacturing of modern materials often involves various deposition techniques, such as chemical vapor deposition (CVD) or physical vapor deposition (PVD) techniques, in which atoms of one or more selected types are deposited on a substrate (wafer) held in low or high vacuum environments that are provided by vacuum deposition chambers. Materials manufactured in this manner may include monocrystals, semiconductor films, fine coatings, and numerous other substances used in practical applications, such as electronic device manufacturing. Many of these applications rely on the purity and uniformity of the materials grown in substrate processing systems as well as uniformity of the processes. The goal of uniformity gives rise to the monitoring and measuring the uniformity of substrates and manufacturing processes. Improving precision, reliability, and efficiency of such techniques presents a number of technological challenges.

SUMMARY

In an example embodiment, an integrated reflectometer (IR) includes a substrate holder, a first actuator, a second actuator, a first sensor, a second sensor, and a processing device. The substrate holder may secure a substrate. The first actuator may rotate the substrate holder about a first axis, and the second actuator may move the substrate holder linearly along a second axis. The first sensor may generate one or more first measurements or images of a first plurality of target positions on the substrate. The second sensor may generate one or more second measurements of a second plurality of target positions on the substrate. The processing device may determine, based on the one or more first measurements or images, an estimate of a position of the substrate on the substrate holder. The processing device may further cause the first actuator to rotate the substrate holder about the first axis for measurement of a target position of the second plurality of target positions. The rotation may cause an offset between a field of view of the second sensor and the target position on the substrate due to the substrate not being centered on the substrate holder. The processing device may further cause the second actuator to move the substrate holder linearly along the second axis to correct the offset. The processing device may further determine a profile (e.g., a uniformity profile) across a surface of the substrate based on the one or more second measurements of the second plurality of target positions.

In an example embodiment, a system may include a transfer chamber, a process chamber, a load lock connected to the transfer chamber, a factory interface (FI) connected to the load lock, and an optical measurement device connected to the FI. The FI may include a robot arm. The robot arm may move a substrate from the process chamber to the optical measurement device. The optical measurement device may include a substrate holder to secure the substrate, a first actuator to rotate the substrate holder about a first axis, a second actuator to move the substrate holder linearly along a second axis, a first sensor to generate one or more first measurements or images of the substrate, a second sensor to generate one or more second measures of a set of target positions on the substrate, and a processing device to estimate, based on the one or more first measurements or images, an estimate of an offset of a center of the substrate relative to a center of the substrate holder.

In an example embodiment, a method includes receiving a substrate on a substrate holder of an optical measurement device. The method further includes determining an estimate of a position of the substrate on the substrate holder. The method further includes measuring, using a sensor, a set of target positions on the substrate. To measure a target position or the set of target positions, the method further includes rotating the substrate holder about a first axis, which may cause an offset between a field of view of the sensor and the target position on the substrate due to the substrate not being centered on the substrate holder. To measure the target position, the method further includes correcting the offset by moving the substrate holder linearly along a second axis and determining, by a processing device, a profile across a surface of the substrate based on measurements of the set of target positions.

BRIEF DESCRIPTION OF THE DRAWINGS

The disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 9 depicts a block diagram of an example computing device capable of process drift and film thickness determination, operating in accordance with one or more aspects of the disclosure.

DETAILED DESCRIPTION

Figure 1:
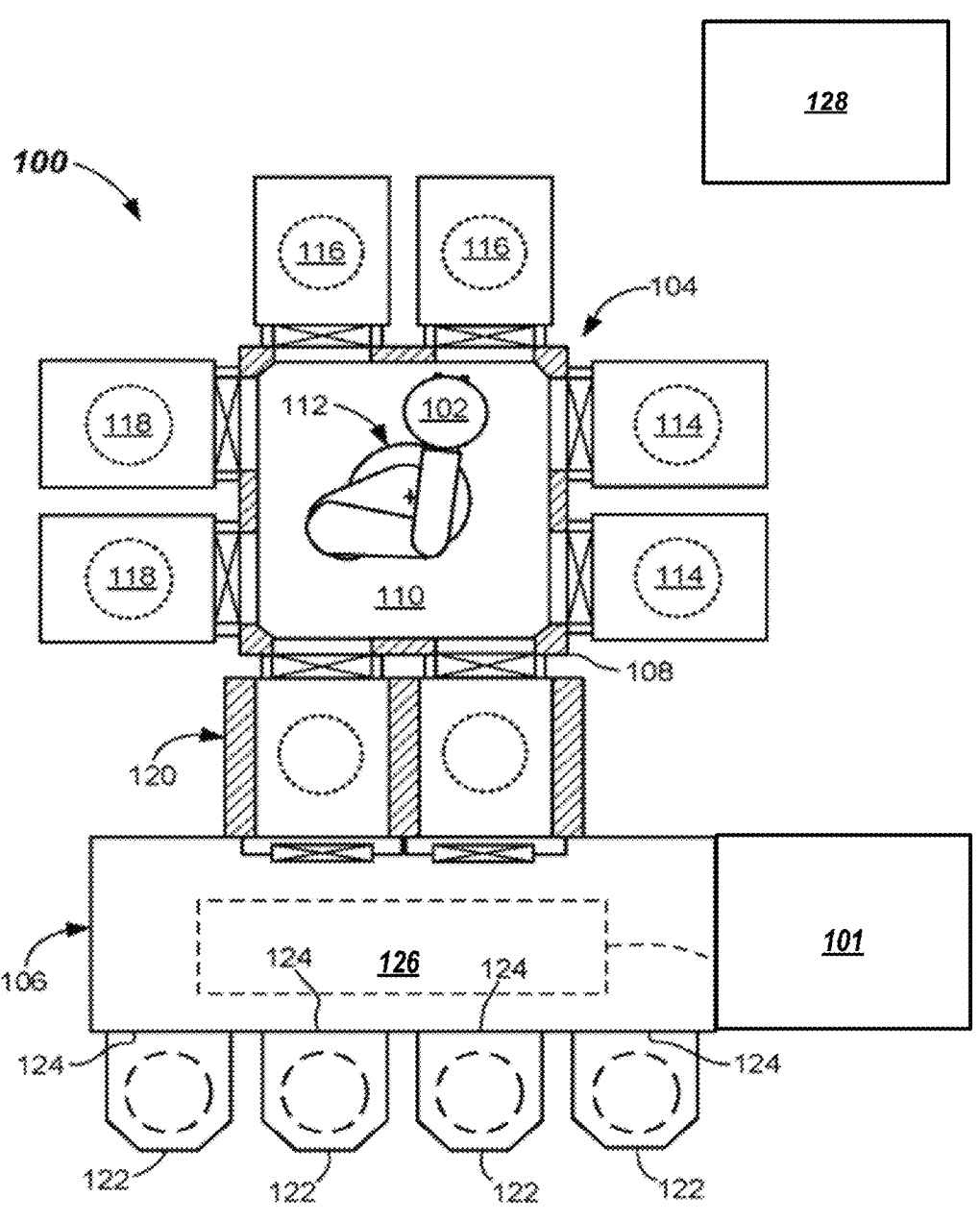
FIG. 1 is a top schematic view of an example processing system, according to one embodiment.

Embodiments described herein are related to systems and methods for measuring film thickness and other parameters such as critical dimensions (CDs), CD-bias (delta between process steps), and other physical parameters related to the substrate processing outcome across all or a portion of a surface of a substrate after the substrate is processed in a processing chamber. Process results, including film thicknesses, CDs, CD-bias, and so on can be monitored across one or more substrates for etch and deposition processes. Film thickness information, CD information, CD-bias information, etc. can be used to monitor process drifts, which can lead to non-uniformities across the surface of the substrate. In embodiments, an integrated reflectometry device or other integrated measurement and/or imaging device is a component of a device manufacturing system. The integrated measurement device may be used to measure a surface of a substrate while the substrate is still in the device manufacturing system. This enables any issues such as film non-uniformity to be detected before many more substrates are processed by a process chamber that caused the film non-uniformity. For example, the integrated measurement device may be used to monitor process drifts and measure uniformity of substrates after processing. The integrated measurement device in embodiments has a small footprint due to a unique design, which enables the integrated reflectometry device to be integrated into a transfer chamber or a factory interface, or attached to a transfer chamber or factory interface without consuming significant factory floor space. The integrated measurement device in embodiments generates an accurate wafer map of a wafer, even when the wafer is not centered on a substrate support in the reflectometry device.

The systems and methods described herein can provide information on and/or alerts of film thickness problems, non-uniformity, process drifts, CDs, CD-bias, and other physical parameters related to the substrate processing outcome to a user quickly, effectively in real time, which can allow the user to correct for film thickness, CD, CD-bias, etc. problems, non-uniformity, process drifts, etc. as they occur. Additionally, aspects of the present disclosure solve the above-mentioned problems and other problems by utilizing a reflectometry and/or other measurement system that includes a substrate support (e.g., a substrate holder) that both rotates and moves linearly to enable a sensor (e.g., an optical sensor) to capture measurements of points all across the surface of the substrate. The measurement system may additionally include a camera or other sensor usable to locate an edge of the substrate secured on the substrate support. The substrate support may be moved in a linear motion until the camera and/or sensor detects the edge. The substrate support may be moved in a rotational manner to determine a center of the substrate, which may not be centered on the substrate support. Once the center of the substrate is determined relative to the center of the substrate support, coordinate transformations may be applied while the substrate is rotated in order to cause an appropriate linear movement of the substrate support to correct for the center of the substrate being offset from a center of the substrate holder. Thus, measurements may be generated for many points on the substrate (e.g., for the entire surface of the substrate), and each measurement may be associated with an accurate location on the substrate.

A rotational motor or actuator may rotate the substrate holder about an axis of rotation, and a linear actuator may move the substrate holder linearly along a linear axis while measurements are generated. In embodiments, a single linear actuator is used together with a rotator, and the substrate holder is moved linearly along only a single axis (referred to as an r-axis). The camera or a first sensor can generate images of a first plurality of target positions on the substrate, and a second sensor may measure one or more target positions of a second plurality of target positions on the substrate, e.g., to find film thickness, CD, material properties, etc. at the one or more target positions. In one embodiment, the edge of the substrate may be located by moving the substrate holder along a linear axis until an edge is identified (e.g., by a camera or sensor). Once the edge of the substrate is identified, the second sensor and/or first sensor or camera may be used to determine a circumference of the substrate by rotating the substrate about the rotational axis and generating one or more images or measurements of the edge (e.g., circumference) of the substrate while rotating the substrate about the rotational axis. In one embodiment, the second sensor is an infrared sensor. In other embodiments, the second sensor may be another type of sensor, such as an optical sensor or a reflectometry sensor.

Based on the images and/or sensor measurements of the first sensor or camera, it may be determined that the substrate is not centered on the substrate holder (e.g., there is an offset between the center of the substrate and the center of the substrate holder) and/or an estimate of an offset position of the substrate on the substrate holder. Coordinate transformations may be determined between the center of the substrate and the center of the substrate holder (about which the substrate holder rotates), and applied to correct for the offset. In some embodiments, the coordinate transformations may be applied during the rotation of the substrate holder to correct for the offset.

In some embodiments, a second sensor, which may be the same sensor as described above or a different sensor, may be a reflectometry sensor. The second sensor measures one or more target positions on the substrate to generate reflectometry measurements of the one or more target positions. In some embodiments, the substrate holder may be a vacuum substrate holder with a mass to provide the substrate holder with inertia allowing for fast rotation. Alternatively, the substrate holder may be an electrostatic substrate holder, or a substrate holder that applies a gripping force on the substrate.

In some embodiments, a profile such as a uniformity profile, a particle count profile, an optical constant profile, etc. across the surface of the substrate may be determined based on the measurements of the one or more target positions.

In some embodiments, at least the substrate holder, the rotational actuator, the linear actuator, a camera, and a sensor may be part of an integrated measurement and/or imaging system such as an integrated reflectometer (IR) system that is coupled to or integrated into a factory interface. The measurement and/or imaging system may have a small three-dimensional footprint, which is possible due the measurement and/or imaging system having the ability to measure the entire surface of the substrate using at most a rotational motion and linear (R-theta) motion. The measurement and/or imaging system may have a much smaller footprint than other optional metrology systems. Additionally, the measurement and/or imaging system may have a higher throughput than other optical metrology systems (e.g., than other reflectometry systems). In some embodiments, the measurement and/or imaging system may instead move the substrate holder in a plane by moving the substrate holder linearly in two directions (e.g., XY).

FIG. 1 is a top schematic view of an example processing system 100, according to one embodiment. In some embodiments, processing system 100 may be an electronics processing system configured to perform one or more processes on a substrate 102. In some embodiments, processing system 100 may be an electronics device manufacturing system. Substrate 102 can be any suitably rigid, fixed-dimension, planar article, such as, e.g., a silicon-containing disc or wafer, a patterned wafer, a glass plate, or the like, suitable for fabricating electronic devices or circuit components thereon.

Processing system 100 includes a process tool 104 (e.g., a mainframe) and a factory interface 106 coupled to process tool 104. Process tool 104 includes a housing 108 having a transfer chamber 110 therein. Transfer chamber 110 includes one or more processing chambers (also referred to as process chambers) 114, 116, 118 disposed therearound and coupled thereto. Processing chambers 114, 116, 118 can be coupled to transfer chamber 110 through respective ports, such as slit valves or the like.

Processing chambers 114, 116, 118 can be adapted to carry out any number of processes on substrates 102. A same or different substrate process can take place in each processing chamber 114, 116, 118. Examples of substrate processes include atomic layer deposition (ALD), physical vapor deposition (PVD), chemical vapor deposition (CVD), etching, annealing, curing, pre-cleaning, metal or metal oxide removal, or the like. In one example, a PVD process is performed in one or both of process chambers 114, an etching process is performed in one or both of process chambers 116, and an annealing process is performed in one or both of process chambers 118. Other processes can be carried out on substrates therein. Processing chambers 114, 116, 118 can each include a substrate support assembly. The substrate support assembly can be configured to hold a substrate in place while a substrate process is performed.

Transfer chamber 110 also includes a transfer chamber robot 112. Transfer chamber robot 112 can include one or multiple arms, where each arm includes one or more end effectors at the end of the arm. The end effector can be configured to handle particular objects, such as wafers. In some embodiments, transfer chamber robot 112 is a selective compliance assembly robot arm (SCARA) robot, such as a 2 link SCARA robot, a 3 link SCARA robot, a 4 link SCARA robot, and so on.

A load lock 120 can also be coupled to housing 108 and transfer chamber 110. Load lock 120 can be configured to interface with, and be coupled to, transfer chamber 110 on one side and factory interface 106 on another side. Load lock 120 can have an environmentally-controlled atmosphere that is changed from a vacuum environment (where substrates are transferred to and from transfer chamber 110) to at or near an atmospheric-pressure inert-gas environment (where substrates are transferred to and from factory interface 106) in some embodiments. In some embodiments, load lock 120 is a stacked load lock having a pair of upper interior chambers and a pair of lower interior chambers that are located at different vertical levels (e.g., one above another). In some embodiments, the pair of upper interior chambers are configured to receive processed substrates from transfer chamber 110 for removal from process tool 104, while the pair of lower interior chambers are configured to receive substrates from factory interface 106 for processing in process tool 104. In some embodiments, load lock 120 are configured to perform a substrate process (e.g., an etch or a pre-clean) on one or more substrates 102 received therein.

Factory interface 106 can be any suitable enclosure, such as, e.g., an Equipment Front End Module (EFEM). Factory interface 106 can be configured to receive substrates 102 from substrate carriers 122 (e.g., Front Opening Unified Pods (FOUPs)) docked at various load ports 124 of factory interface 106. A factory interface robot 126 (shown dotted) can be configured to transfer substrates 102 between substrate carriers 122 (also referred to as containers) and load lock 120. In other and/or similar embodiments, factory interface 106 is configured to receive replacement parts from replacement parts storage containers 123. Factory interface robot 126 can include one or more robot arms and can be or include a SCARA robot. In some embodiments, factory interface robot 126 has more links and/or more degrees of freedom than transfer chamber robot 112. Factory interface robot 126 can include an end effector on an end of each robot arm. The end effector can be configured to pick up and handle specific objects, such as wafers. Alternatively, or additionally, the end effector can be configured to handle objects such as process kit rings.

Any conventional robot type can be used for factory interface robot 126. Transfers can be carried out in any order or direction. Factory interface 106 can be maintained in, e.g., a slightly positive-pressure non-reactive gas environment (using, e.g., nitrogen as the non-reactive gas) in some embodiments.

Processing system 100 can include an integrated measurement and/or imaging system 101, which may be, for example, a reflectometry (IR) system. Reflectometry is a measurement technique that uses measured changes in light reflected from an object to determine geometric and/or material properties of the object. Reflectance spectrometers measure the intensity of reflected light across a range of wavelengths. For dielectric films these intensity variations may be used to determine the thickness of the film. Additionally, reflectometry measurements may be used to detect CD, CD-bias, and other physical parameters related to a substrate processing outcome.

Measurement and/or imaging system 101 may be connected to factory interface 106. Alternatively, measurement and/or imaging system 101 may be connected to transfer chamber (e.g., at a location of one of the illustrated processing chambers). Alternatively, the measurement and/or imaging system 101 may be positioned in an interior of the factory interface 106 or transfer chamber 110. Measurement and/or imaging system 101 may also be a standalone system that is not connected to processing system 100. Measurement and/or imaging system 101 may be mechanically isolated from factory interface 106 and from an external environment to protect measurement and/or imaging system 101 from external vibrations. In some embodiments, measurement and/or imaging system 101 and its contained components may provide analytical measurements (e.g., thickness measurements) that may provide a profile across a surface of a substrate, such as a thickness uniformity profile, a particle count profile, a CD profile, a CD uniformity profile, an optical constant profile, a material property profile, and so on. Measurement and/or imaging system 101 may provide feedback to a user regarding the uniformity profile. Measurement and/or imaging system 101 may be an assembly that has the ability to measure film thicknesses, CD, CD-bias, optical properties, particle count, material properties, surface roughness, etc. across the entire substrate after it is processed in a chamber. Such metrology may be used to monitor process drift, out-of-specification film thickness, out-of-specification CD, CD-bias, etc. for etch, deposition, and/or other processes. The results of the measurement may be used to quickly correct or adjust process parameters of one or more process recipes executed on one or more process chambers to account for any determined process drift. Additionally, the results of the measurements may be used to determine when to perform maintenance on a process chamber, when to perform further testing on a substrate, when to flag a substrate as being out-of-specification, and so on. Although depicted as being connected to factory interface 106, in other embodiments, measurement and/or imaging system 101 may be a standalone reflectometry system or may be positioned at another location in or attached to processing system 100, as described above.

Factory interface robot 126 may place a substrate on a substrate transfer lift (e.g., lift pins) of measurement and/or imaging system 101. In one embodiment, the substrate transfer lift may then lower the substrate onto a substrate support such as a chuck (e.g., a vacuum chuck or electrostatic chuck) of measurement and/or imaging system 101. In other embodiments, the substrate may instead be lowered onto another type of substrate holder, such as a mechanical chuck, a magnetic chuck, or the like. Measurement and/or imaging system 101 may include various covers and a ventilation system to maintain a clean substrate and environment.

Within measurement and/or imaging system 101, the substrate holder may be translated by a linear actuator so that an edge of the substrate is centered under an optical camera. The substrate and the substrate holder may then be rotated by a rotation motor (actuator) and an optical camera or first sensor (e.g., an IR sensor, visible light sensor, etc.) may capture images or measurements of the edge of the substrate. Motion of the substrate holder about a rotational axis may be referred to as theta motion, motion of the substrate holder along a linear axis may be referred to as r motion, and combined motion of the substrate holder about the rotational axis and along the linear axis may be referred to as r-theta motion herein. As will be described in further detail below, the images or measurements may be analyzed to determine a center point of the substrate. Moving the substrate holder with both a linear (e.g., radial) and rotational motion allows the total size of measurement and/or imaging system 101 to be minimized while still enabling the capturing of measurements along the entire surface of the substrate. For example, the measurement and/or imaging system 101 may have a width of about 16"-17", a length of about 23"-24", and a height of about 25"-26" in an embodiment. In some embodiments, an measurement and/or imaging system 101 can be implemented with two linear actuators and no rotational actuator (where motion for such as a system is referred to as X-Y motion), however, this may lead to the measurement and/or imaging system having a larger footprint than measurement and/or imaging system 101. In some embodiments, measurement and/or imaging system 101 may have the capability to measure film thicknesses, CD, CD-bias, etc. of up to about 100 substrates or more per hour, which is a substantial increase in throughput as compared to traditional optical metrology systems that measure a full surface of a substrate. For each substrate, hundreds to thousands (e.g., 3000) points on each substrate may be measured. The measurements may be used to determine uniformity profiles of the substrates. Accordingly, in embodiments measurement and/or imaging system 101 may be able to determine a uniformity profile of a substrate in a time duration between 20 seconds and 50 seconds.

A sensor (e.g., a reflectometer), e.g., a second sensor, of measurement and/or imaging system 101 may be used to make measurements of one or more target positions on the substrate as it is moved by the linear actuator and the rotational motor. The one or more target positions may be determined based on an algorithm or set of instructions that specifies the location of the target positions and the number of target positions to be measured. In some instances, the substrate may not be centered on the substrate holder. In such an instance, processing logic may determine coordinate transformations to transform between a coordinate system centered on the substrate holder and a coordinate system centered on the substrate. Appropriate transformations may be applied for each position to be measured on the substrate. Accordingly, as the substrate holder (and thus the substrate attached to the substrate holder) are rotated, the substrate holder (and thus the substrate) are also moved linearly according to the transformations so that the correct point on the substrate is measured.

During setup of measurement and/or imaging system 101, the linear actuator and the rotational motor may be calibrated to determine the location of the reflectometer in relation to the axes of motion of the linear actuator and/or the rotational motor. Additionally, the substrate holder may have an integrated reference target (or multiple integrated reference targets), which can be measured by the second sensor (e.g., reflectometer) and/or captured by the first sensor (e.g., camera) to obtain reference measurements/images. The integrated reference target(s) may be positioned on the substrate holder and/or on a stage that supports the substrate holder at a position that will not be covered by the substrate, and may rotate and/or otherwise change position as the substrate holder is rotated and/or moved. An integrated reference target may have a known thickness, which does not change over time.

In one embodiment, the measurement and/or imaging system includes multiple reference targets, which may be made of different materials. For example, one reference target may include bare silicon, and one reference target may include silicon with a silicon dioxide layer having a known thickness. The sensor may periodically measure the thickness of the integrated reference target and compare the measured thickness to the known thickness of the integrated reference target. If the measured thickness does not correspond to the known thickness of the target, then processing logic may determine that the sensor is generating inaccurate measurements. In some embodiments, a linear offset may be determined based on a determined difference between the measured thickness and the known thickness of the integrated reference target. Alternatively, a non-linear offset may be determined. The linear or non-linear offset may be applied to measurements in order to obtain accurate adjusted measurements of film thickness. In one embodiment, processing logic determines whether the difference between the measured thickness of the reference target and the known thickness of the reference target exceeds a difference threshold. If the difference is below the difference threshold, then an adjustment may be applied, as described above. If the difference is at or above the difference threshold, then the measurement and/or imaging system 101 may be scheduled for maintenance. Measurement and/or imaging system 101 may perform calibration of the second sensor (e.g., reflectometer) either between measurements, during measurements, or both to determine appropriate offsets to apply to measurements.

In one embodiment, the integrated reference target may cause spectral reflections on the second sensor (e.g., reflectometer) from when it scans across the reference target while setting the stage. Processing logic can determine where the second sensor is relative to the target based on the positions (e.g., (r, theta) coordinates) at which spectral reflections are captured. A similar process may be determined for the first sensor (e.g., the camera). This can provide two coordinate systems that are both referenced by the target. The relationship between the first sensor coordinate system and the second sensor coordinate system can therefore be figured out through the reference target.

When the substrate is lowered onto and secured to the substrate holder, the center of the substrate may be offset from the center of the substrate holder. A processing device of measurement and/or imaging system 101 may determine one or more coordinate transformations between the center of the substrate and the center of the substrate holder (the center of the substrate holder corresponds to the axis of rotation about which the substrate holder rotates), and apply the one or more coordinate transformations to correct the offset, as described in greater detail below.

Processing system 100 can also include a system controller 128. System controller 128 can be and/or include a computing device such as a personal computer, a server computer, a programmable logic controller (PLC), a microcontroller, and so on. System controller 128 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 128 can include a data storage device (e.g., one or more disk drives and/or solid state drives), a main memory, a static memory, a network interface, and/or other components. System controller 128 can execute instructions to perform any one or more of the methodologies and/or embodiments described herein. The instructions can be stored on a computer readable storage medium, which can include the main memory, static memory, secondary storage and/or processing device (during execution of the instructions). In embodiments, execution of the instructions by system controller 128 causes system controller to perform the methods of FIG. 5. System controller 128 can also be configured to permit entry and display of data, operating commands, and the like by a human operator.

Figure 2A:
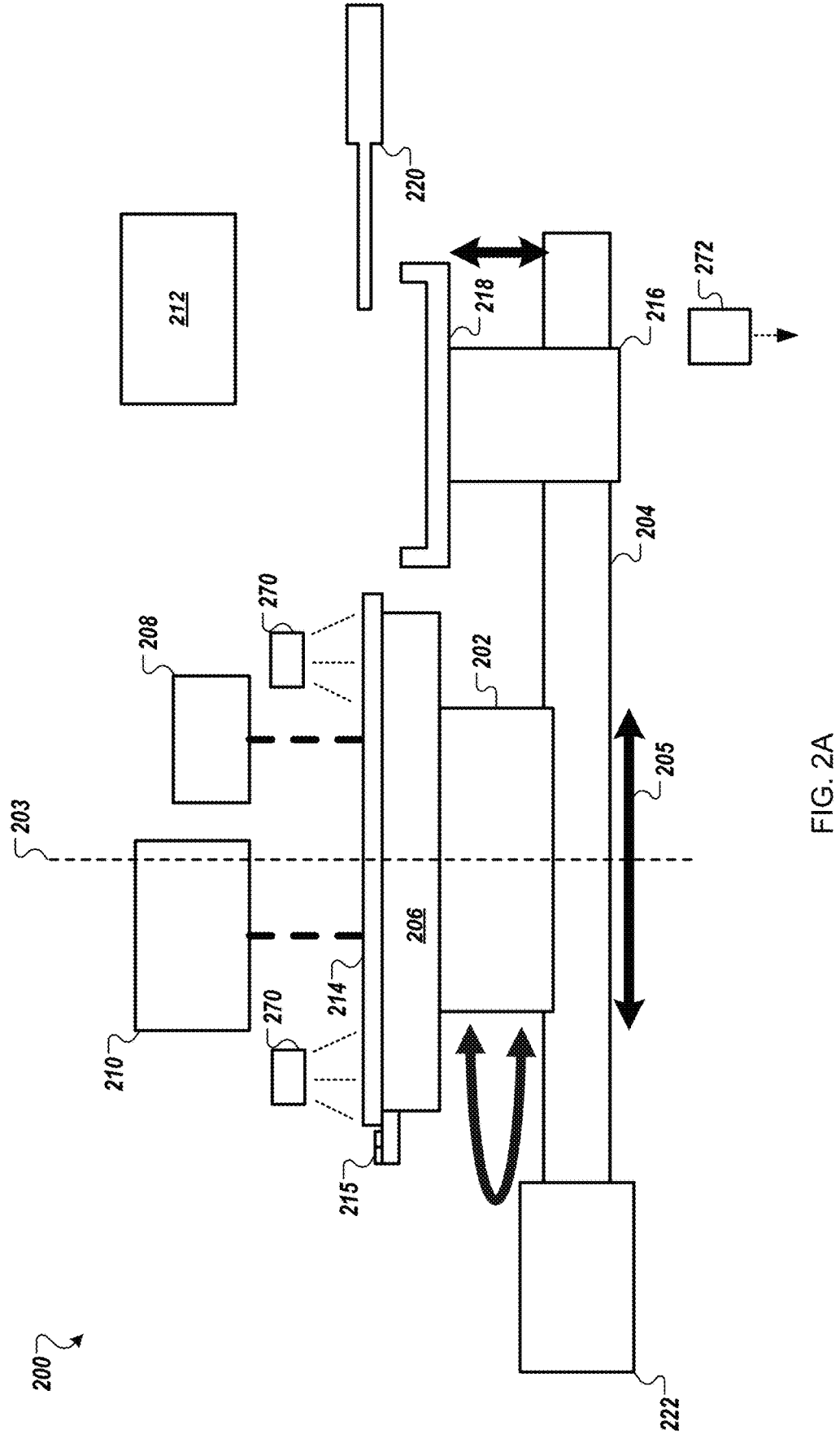
FIG. 2A is a cross-sectional schematic diagram of an IR system with a rotational actuator and a linear actuator according to one embodiment.

FIG. 2A is a schematic cross-sectional side view diagram of a measurement and/or imaging system 200 with a rotational actuator 202 and a linear actuator 204 according to one embodiment. Measurement and/or imaging system 200 may correspond to measurement and/or imaging system 101 of FIG. 1 in embodiments. Rotational actuator 202 may be a motor, a rotary actuator (e.g., an electric rotary actuator), or the like. Linear actuator 204 may be an electric linear actuator, which may convert rotational motion in motors into linear or straight motions along an axis. Measurement and/or imaging system 200 may include a substrate holder 206, a camera 208, a sensor 210, and a processing device 212.

Substrate holder 206 may be a chuck such as a vacuum chuck, an electrostatic chuck, a magnetic chuck, a mechanical chuck (e.g., a four jaw chuck, a three jaw chuck, an edge/ring clamp chuck, etc.) or other type of chuck. Substrate holder 206 may also be or include a plate or other surface with a substrate-shaped pocket and/or a set of pins or other features (e.g., three pins) that surround the substrate and keep the substrate from shifting relative to the substrate holder 206 during movement of the substrate holder 206. Substrate holder 206 may secure a substrate 214 (e.g., a wafer). In one embodiment, the substrate holder 206 includes an edge clamp that clamps the substrate from the edges. In one embodiment, substrate holder 206 is a vacuum chuck. In other embodiments, substrate holder 206 may be a different type of chuck such as an electrostatic chuck, a mechanical chuck, a magnetic chuck, or the like.

Rotational actuator 202 may rotate substrate holder 206 about a first axis 203. Rotational actuator 202 may be controlled by a servo controller and/or servomotor, which may allow for precise control of a rotational position, velocity and/or acceleration of the rotational actuator and thus of substrate holder 206. Substrate holder 206 may have a mass between 1.0 kilograms (kg) and 2.0 kg, which allows for rotational accelerations between 6000 deg/sec$^2$ and 14000 deg/sec$^2$. Linear actuator 204 may move substrate holder 206 linearly along a second axis 205. Linear actuator 204 may be controlled by a servo controller and/or servomotor 222, which may allow for precise control of a linear position, velocity, and acceleration of linear actuator 204, and thus of substrate holder 206.

Camera 208 may be positioned above substrate holder 206, and may generate one or more images of substrate 214 held by substrate holder 206. Camera 208 may be an optical camera, an infrared camera, or other suitable type of camera. Alternatively, camera 208 may be replaced by another type of sensor. A sensor 210 may also be positioned above substrate holder 206, and may measure at least one target position on the substrate at a time. Depending on a sensor type of sensor 210, the measurement may be a reflectometry measurement, an optical property measurement, a particle count measurement, a CD measurement, a roughness measurement, a surface geometry measurement, and/or other type of measurement. Camera 208 (or other sensor) and sensor 210 may be fixed in a stationary position on measurement and/or imaging system 200, while substrate holder 206 may be moved in an r-theta motion by rotation actuator 202 and linear actuator 204.

In some embodiments, due to the capability of the chuck to be moved according to an r-theta motion, outer dimensions of measurement and/or imaging system may be compact, (e.g., having dimensions between 20 inches and 28 inches in a first dimension, 22 inches and 28 in a second dimension, and 14 inches and 20 inches in a third dimension, with the first dimension, the second dimension, and the third dimension being mutually perpendicular), in comparison to an measurement and/or imaging system which moves the chuck in a rectangular (XY) motion system. In addition, by moving the chuck using an r-theta motion system, substrates can be processed (e.g., their uniformity profile can be determined) at a rate of up to 100 substrates per hour or more. In other words, processing device 212 may be able to generate thickness measurements of an entire substrate 214 and determine a uniformity profile of the substrate 214 in a time duration between 20 seconds and 50 seconds in embodiments.

In some embodiments, processing device 212 may determine, based on the one or more images or other measurements of substrate 214 generated by camera 208 or other sensor, that substrate 214 is not centered on substrate holder 206 and/or an estimate of a position of the substrate on the chuck (e.g., an estimate of the center of the substrate on the chuck). Substrate 214 may be not centered on substrate holder 206 when it is initially placed on substrate holder 206. A robot blade 220 may place substrate 214 on a transfer station 218 (e.g., on a set of lift pins or other lift mechanisms). Substrate holder 206 may be moved in a first direction along second axis 205 such that substrate holder 206 is positioned at transfer station 218. Transfer station 218 may be situated on a lift mechanism 216 (or may be a set of lift pins), which may move transfer station 218 up and down in a vertical direction (that is perpendicular to second axis 205 and parallel to first axis 203). Substrate 214 may be received by substrate holder 206 while substrate holder 206 is positioned at transfer station 218. Substrate 214 may not be centered on substrate holder 206. Substrate holder 206 may be moved in a second direction along second axis 205 until an edge of substrate 214 is detected to be at a target position by sensor 210.

The substrate holder 206 may be rotated 360 degrees, and images or other measurements (optionally referred to as edge images or circumference images) may be generated during the rotation of the substrate holder 206. One or more of the measurements and/or images may be taken with the substrate holder at different theta values, and the detected location of the edge may vary. A change in the detected edge may indicate that the substrate (which may be a circular substrate) is off center. Additionally, the determined change in the detected edge may be used to compute the amount of offset. Because the camera, sensor and stage are synchronized, a circumference image scan can be achieved in 3-6 seconds without stopping the stage in embodiments.

Edge images (e.g., image frames) may be analyzed by an image processing system. The image processing system detects the edge of the substrate and a position of a flat or notch in the substrate. In one embodiment, the measurement and/or imaging system 200 is connected to an illumination system (e.g., comprising one or more light sources such as light emitting diodes (LEDs)) that can turn on and off when camera measurements and/or sensor measurements (e.g., spectrometer measurements) are collected. In one embodiment, the image processing system corrects for illumination nonuniformity and finds a boundary of the wafer edge. The edge positions for each image frame may be input into a circle fitting least-squares optimization algorithm. A notch (or flat) angle may be determined by combining the angle of the image with the most probable notch or flat candidate and the position of the notch or flat within the image. The fitted circle may be the center of the substrate, and the notch angle may be the angular offset.

In one embodiment, in addition to or instead of generating images of an edge of the substrate, a camera generates images of features (e.g., alignment features) on the surface of the substrate. The features may have known positions on the substrate, and may be used to determine a center of the substrate in embodiments. In some embodiments, an initial estimate of a center of the substrate is determined based on images of an edge of the substrate, and a refined or improved estimate of the center of the substrate is determined based on images of the features on the surface of the substrate.

In one embodiment, the parameters (r, theta) determine the offset of the substrate relative to the stage. With these parameters, the motion system can create forward and inverse transformations that converts (r, theta) coordinates of the stage to (r, theta) coordinates of the substrate. The motion system can then compute trajectories in the space of the substrate while sending commands to move the motors attached to the substrate holder 206. In one embodiment, the motion system can compute trajectories in an arbitrary space because it runs a real-time control software that is connected to the motion drives of the linear actuator and the rotational actuator (e.g., through an EtherCAT network). Controller 212 may compute the corrected trajectory and transmit commanded positions to the motion drives in real-time (e.g., at a 1 kHz rate).

In some embodiments, additional calibrations are performed to determine one or more of the following:

1. A camera stage/chuck origin defined by the stage/chuck center of rotation;
2. A camera misalignment with the stage/chuck center of rotation;
3. A camera mounting error; and
4. A boresight correction between the sensor and the camera;
5. One or more additional calibrations to address, for example, tip, tilt and/or wobble.

The calibrations may be used to compute a sensor-stage origin and transformations applied to camera measurements and/or sensor measurements. The calibrations may ensure that the sensor measurements and/or camera measurements are accurate with respect to absolute substrate coordinates. Optics heads of the sensor (e.g., reflectometer) and the camera may have adjustments to place them approximately on a center of the rotation axis (e.g., center of the chuck) in embodiments. Additionally, alignment algorithms can add additional accuracy to the measurement position beyond mechanical adjustment tolerances.

In some embodiments, a sensor such as an IR sensor, laser sensor or other light sensor may be used to detect the substrate edge in addition to, or instead of, a camera 208. The IR sensor, laser sensor or other light sensor may include one or more light source or emitter and one or more detector, or one or more light source/detector and one or more mirror. In one embodiment, while no substrate is interposed between a light emitter (e.g., a laser, IR emitter or other light emitter) and the detector, or between a source/detector and the mirror, then no substrate is detected by that detector. However, once the substrate is interposed between a light source and detector, or between a source/detector and a mirror, a beam is broken and the substrate is detected. The r-theta coordinates accompanied by data on whether or not the substrate was detected at multiple r-theta coordinates can be used to determine that the substrate is off center and/or an amount of offset. In embodiments, a single light source and detector pair or a single light source/detector and mirror pair are used. Alternatively, multiple light source and detector pairs or multiple light source/detector and mirror pairs may be used. The multiple light source and detector pairs or light source/detector and mirror pairs may be arranged in a detection array in embodiments. If multiple light source and detector pairs or light source/detector and mirror pairs are used, then these pairs may be arranged such that they provide a light curtain. The light curtain may provide multiple data points for detection of the substrate.

In some embodiments, the substrate includes a notch and/or a flat. The images from camera 208 and/or the sensor measurements from a sensor (e.g., an edge sensor such as an IR or laser sensor) may be used to determine a location of a flat and/or notch. X-Y positions may be determined on the substrate based on the determined location of the flat or notch. The X-Y positions may be translated into r-theta positions, and r-theta positions may be translated into X-Y positions.

In some embodiments, the rotation of substrate holder 206 by rotational actuator 202 for measurement of a target position causes an offset between a field of view of sensor 210 and the target position on substrate 214 due to substrate 214 not being centered on substrate holder 206. In this case, linear actuator 204 may move substrate holder 206 linearly along the second axis to correct the offset. Then, sensor 210 may measure target positions on substrate 214. Once measurements of all target points on the substrate are measured, processing device 212 may determine a uniformity profile across the surface of substrate 214 based on the measurements.

The motion system of the measurement and/or imaging system 200 (e.g., the linear actuator 204 and the rotational actuator 206) may be synchronized with the camera 208 and/or sensor 210, such as through digital trigger signals sent over an EtherCAT network. Drives of the motion system may be connected to a real-time control server through an EtherCAT network, for example. The network enables the linear actuator 204 and/or rotational actuator 206 to receive and act on commands at a rate of up to 1 kHz in embodiments. The control network enables processing logic to transform the coordinates and path of measurements on the wafer.

In some embodiments, processing device 212 may determine one or more coordinate transformations between a center of substrate holder 206 (corresponding to first axis 203 about which substrate holder 206 rotates) and a center of substrate 214 that are applied during the rotation of substrate holder 206 to correct for the offset.

In some embodiments, in order to identify the center of substrate 214, sensor 210 may identify a number of points on an edge of substrate 214 (either via measurements or via images from camera 208), and fit those points to a circle using one or more techniques, such as using a regression analysis fitting technique. In other words, the edge positions for each image may be fed into optimization circle fitting algorithm to determine a circle. A notch angle may be found by combining an angle of the image with a most-probable notch candidate and the position of the notch within the image. The fitted circle is indicative of the center of substrate 214, and the notch angle is indicative of the angular offset.

In some embodiments, in order to identify the center and orientation of substrate 214 with higher accuracy, sensor 210 may measure positions of a number of substrate alignment targets via images from camera 208. Substrate alignment targets may include substrate marks, patterns, lines, edges, corners, and/or the like. One or more training images of substrate alignment targets may be stored on processing system 100. Images of the substrate alignment targets may be captured and compared with training images to determine translation. Embodiments can determine translation with sub-pixel accuracy by image registration algorithms using techniques such as fast Fourier transform (FFT) methods or convolutional neural network (CNN) deep learning methods. The image registration translation between substrate alignment targets and training images form position measurements of alignment targets. The position measurement of multiple substrate alignment targets may be used to fit a coordinate transformation giving additional accuracy. The measurements may be combined using a fitting algorithm (e.g. least squares) to refine the estimate of substrate center and orientation.

Some embodiments may identify substrate center and orientation with edges and a notch. Some embodiments may identify substrate center and orientation with substrate alignment targets. Some embodiments may identify substrate center and orientation in two steps with step one finding edges and notch; and step two finding substrate alignment targets.

In one embodiment, the sensor 210 and camera 208 (or other sensor) are mounted to a structure that is in turn mounted to a plate. The chuck and actuators may also be mounted to the plate. Thus, the entire system including the moving parts (e.g., chuck, actuators, etc.) and the measurement devices (e.g., camera and sensor) may all be mounted to the same plate, which is isolated from an external environment. This provides vibration isolation to the sensors as well as to the chuck from an external environment (e.g., a factory interface), and improves accuracy of measurements.

In one embodiment, one or more integrated reference targets 215 are attached to one end of the substrate holder 206. In one embodiment, the one or more integrated reference targets 215 include a silicon reference target and a silicon dioxide reference target. The one or more integrated reference targets 215 may be used to maintain calibration of sensor 210. In one embodiment, at least one of the one or more integrated reference targets 215 includes a coating (e.g., of silicon dioxide) having a known thickness, optical property or properties, material property or properties, particle count, etc. Sensor 210 may periodically measure a thickness and/or other property of the coating on the integrated reference target 215. The measured thickness and/or other property may then be compared to the known thickness and/or other property of the coating. If the measured thickness and/or other property does not match the known thickness and/or other property, then a determination may be made that the sensor 210 is not correctly calibrated. In one embodiment, a difference between a measured thickness and a known thickness is determined. The difference may then be compared to one or more difference thresholds. If the difference is less than a difference threshold, then an adjustment factor may be determined, and that adjustment factor may be added to future measurements of the sensor 210. If the difference is greater than the difference threshold, then maintenance of the sensor 210 may be scheduled. Similar computations may be performed for other measured and known properties of the film on the reference target.

In one embodiment, the one or more integrated reference targets 215 include a calibration target at a fixed position on the substrate holder 206. The calibration target may be a bare metal or silicon target. In one embodiment, the calibration target is a stainless steel target. The calibration target may cause spectral reflections on the sensor 210 when it has a first particular position relative to the sensor 210 (e.g., when it is directly beneath the sensor 210) and/or may cause spectral reflections on the camera 208 when it has a second particular position relative to the camera 208. The calibration target rotates with the chuck, and can be used to locate and/or calibrate a center of a sensor head of sensor 210 relative to a center of a sensor head of camera 208. The R and theta values of the substrate holder 206 that are associated with a sensor measurement of sensor 210 that results in a spectral reflection may be used to determine where the sensor 210 is relative to the calibration target. Similarly, the R and theta values of the substrate holder 206 that are associated with a camera measurement of camera 208 that results in an image in which the calibration target is at a center of the image may be used to determine where the camera 208 is relative to the calibration target. The r-theta value associated with the spectral reflection of the sensor 210 and the r-theta value associated with the centered calibration target image of the camera 208 may together be used to determine relative positions of the camera 208 and the sensor 210. In one embodiment, controller 212 causes the substrate holder to rotate and moves the substrate holder linearly to position the substrate holder such that the target is located and centered in an image of the camera 208. The substrate holder 206 is then translated so that the target is beneath a head of the sensor 210. This may be achieved by moving the substrate holder until a reading of the sensor 210 has a maximum value. The distance between the position of the substrate holder at which the target was in the center of images generated by the camera and the position of the substrate holder at which the target was directly beneath the sensor 210 may then be determined.

In some embodiments, IR system 200 includes one or more diffusers 270 positioned above the substrate holder 206 (and above the substrate 214 when the substrate 214 is placed on the substrate holder 206). The one or more diffusers 270 may flow a gas (e.g., clean dry air, nitrogen, and/or another gas) towards the substrate 214 to prevent particles from migrating onto the substrate 214. The diffusers 270 may flow the gas toward the substrate at any angle, such as at a 90 degree angle, at an obtuse angle and/or at an acute angle. In some embodiments, the IR system 200 further includes an exhaust 272 to exhaust gas (e.g., the gas output by the diffuser(s) 270) and/or any particles moved by the gas out of an enclosure of the IR system 200. The exhaust 272 may pull particles away from the substrate 214 in embodiments.

Figure 2B:
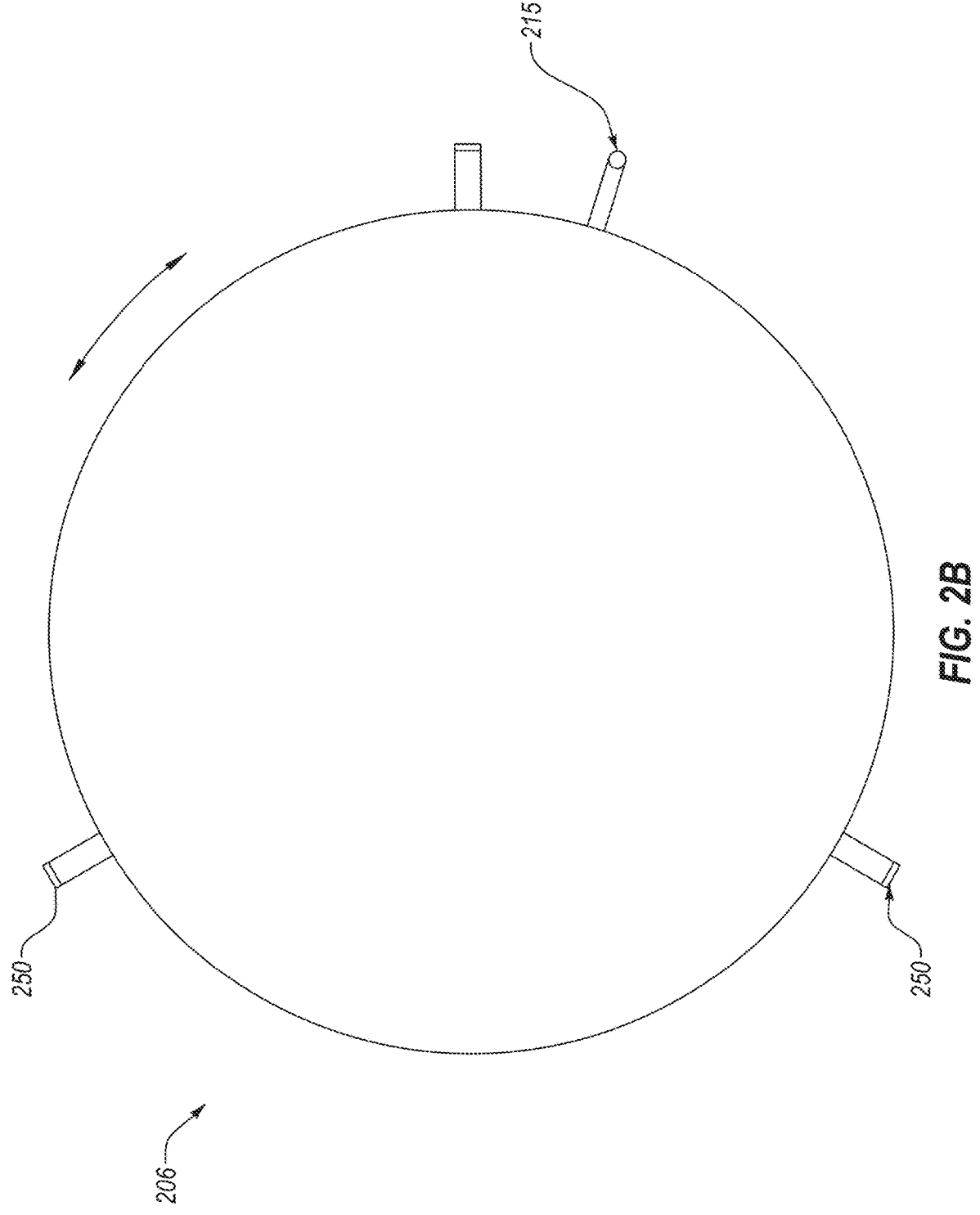
FIG. 2B is a top-down schematic diagram of a substrate holder of the IR system of FIG. 2A according to one embodiment.

FIG. 2B is a top-down schematic diagram of the substrate holder 206 of the IR system 200 of FIG. 2A according to one embodiment. The substrate holder 206 may rotate clockwise and/or counterclockwise about an axis at a center of the substrate holder 206 in embodiments. As shown, the substrate holder 206 includes one or more integrated reference targets 215. In one embodiment, the substrate holder 206 includes a plurality of integrated stops (e.g., wafer stops) 250 to prevent the substrate 214 from moving off of the substrate holder 206 if a holding force such as vacuum pressure or electrostatic force is lost. In one embodiment, the substrate holder 206 includes three integrated stops arranged about a periphery of the substrate holder 206. The stops 250 may be adjustable, and a distance of each of the stops from a center of the substrate holder 206 may be adjusted. In one embodiment, the stops 250 are evenly arranged about the perimeter of the substrate holder 206.

Figure 3:
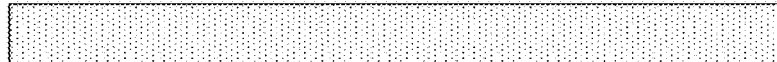
FIG. 3 is a schematic diagram representing rotational and linear coordinates of a substrate holder of an IR system according to one embodiment.

FIG. 3 is a top down schematic diagram representing rotational coordinates of a substrate holder of an IR system 300 according to one embodiment. IR system 300 may be the same as or similar to IR system 101 of FIG. 1 and/or IR system 200 of FIG. 2A. The substrate holder may be the same or similar to substrate holder 206 of FIGS. 2A-B. The substrate holder may be positioned on a stage, which may be rotated about a rotational axis (such as first axis 203) to cause the substrate holder to also rotate. In addition, the stage may be moved about a linear axis such as second axis 205 to cause the substrate holder to also be moved. These motions allow the substrate holder, and thus any substrate secured to the substrate holder, to move according to an r-theta motion. In other words, the rotational motion allows the substrate holder to rotate by an azimuthal angle, while the linear motion allows the substrate holder to move in a radial direction, thus allowing for a full range of motion of the substrate holder and measurement of an entire surface of the substrate.

The motion system driving the stage may be synchronized with a camera and/or a reflectometer sensor through digital trigger signals. The digital trigger signals may be transmitted via a network (e.g., such as an EtherCAT network, or other type of suitable network). The network may allow for sending the trigger signals to control the motion system at a specific rate (e.g., 1 kilo-Hertz (kHz)).

The substrate holder may be positioned at an initial position defined by its radial and angular coordinates (e.g., polar coordinates): $(r_0, \theta_0)$ which can also be equivalently expressed in rectangular (Cartesian) coordinates: $(x_0, y_0)$. The camera and the reflectometer may be located above (in a direction along the rotational axis) the substrate holder, and radial distances of $R_c$ and $R_r$, respectively. Therefore, by rotating the substrate holder from its initial angle, $\theta_0$, and by moving the substrate holder linearly from its initial linear coordinate, $r_0$, the entire surface of the substrate holder, and thus the substrate secured by the substrate holder, may be scanned.

Figure 4:
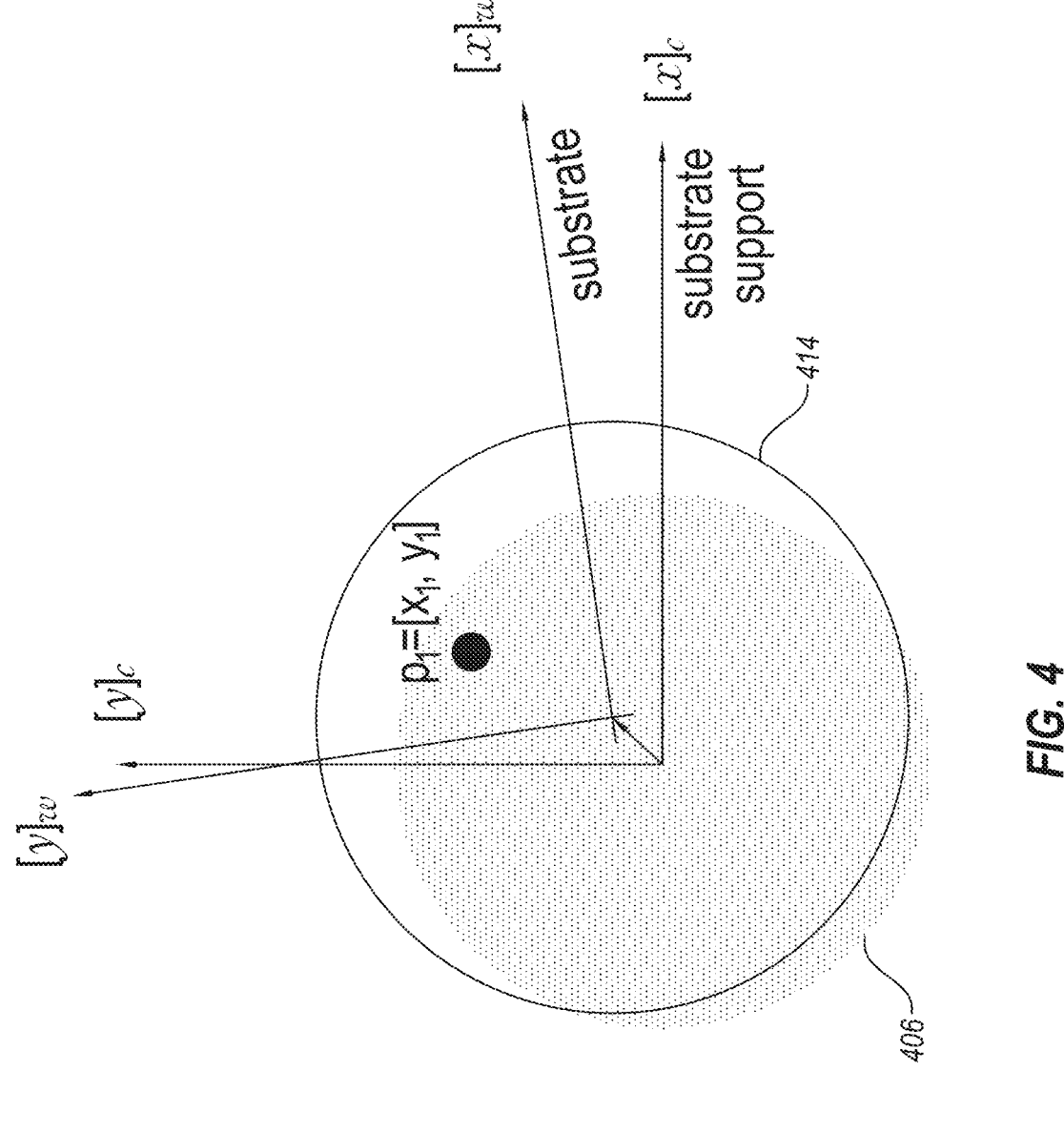
FIG. 4 is a schematic diagram of a substrate placed on a substrate holder according to one embodiment.

FIG. 4 is a schematic diagram of a substrate 414 placed on a substrate holder 406 according to one embodiment. Substrate holder 406 may be the same as or similar to substrate holder 206 of IR system 200 of FIG. 2. In some embodiments, there may be an error in placing substrate 414 onto substrate holder 406, such that a center of substrate 414 is offset from a center of substrate holder 406.

In one embodiment, a first coordinate system may be defined with an origin at the center of substrate holder 406: $(p_0)_c=[0, 0, 0]$, where the first value corresponds to a first axis (e.g., an x-axis), the second value corresponds to a second axis perpendicular to the first axis (e.g., a y-axis), and the third value corresponds to an angle measured from the first axis towards the second axis. In addition, a second coordinate system can be defined analogously to the first coordinate system, except with the origin at the center of substrate 414: $(p_0)$, $=[0, 0, 0]$. If there is an error in the placement of substrate 414, the center of substrate 214 may be expressed in the first coordinate system: $[x_{offset}, y_{offset}, \theta_{offset}]=[x_0, y_0, \theta_0]$.

An arbitrary point $p_1=[x_1, y_1]$ can be expressed in the first coordinate system as $(p_1)_c=[x_1, y_1]_c$ and in the second coordinate system as $(p_1)_w=[x_1, y_1]_w$. A coordinate transformation between the first and second coordinate systems can be defined $$(p_1)_c = T_w^c (p_1)_w,$$

where $$T_w^c = \begin{bmatrix} \cos\theta_0 & -\sin\theta_0 & x_0 \\ \sin\theta_0 & \cos\theta_0 & y_0 \\ 0 & 0 & 1 \end{bmatrix} \qquad (1)$$

An inverse transformation $$T_c^w$$

can be defined between the second coordinate system and the first coordinate system such that $$(p_1)_w = T_c^w (p_1)_c,$$

where $$T_c^w = (T_w^c)^{-1} = \begin{bmatrix} \cos\theta_o & \sin\theta_o & -x_o\cos\theta_o - y_o\sin\theta_o \\ -\sin\theta_o & \cos\theta_o & x_o\sin\theta_o - y_o\cos\theta_o \\ 0 & 0 & 1 \end{bmatrix} \quad (2)$$

Additionally, the point, $p_1$, may be expressed in polar coordinates (e.g., $(p_1)_{w,polar}=[r_1, \alpha_1]_{w,polar}$ and $(p_1)_{c,polar}=[r_1, \alpha_1]_{c,polar}$) using general transformations $$[x, y] = [r\cos\theta, r\sin\theta] \text{ and inversely, } [r, \theta] = \left[\sqrt{x^2 + y^2}, \tan^{-1}\frac{y}{x}\right].$$

Figures 5A, 5B, 5C, 5D:
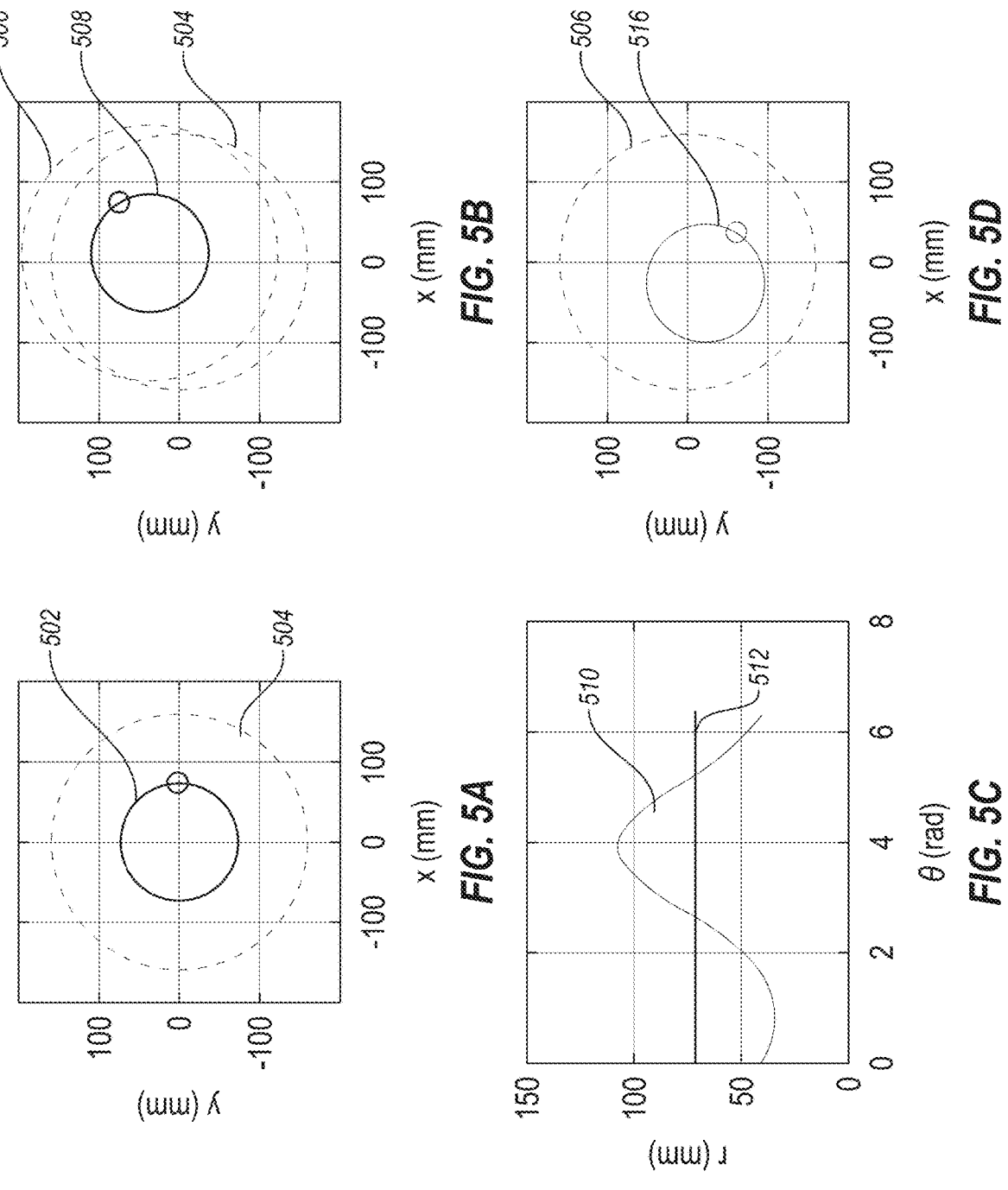
FIGS. 5A-D are a series of graphs illustrating example transformations for a circular trajectory according to one embodiment.

FIGS. 5A-D are a series of graphs illustrating an example of how a substrate's placement offset on the substrate holder can be canceled out for a circular trajectory according to one embodiment. FIG. 5A shows a substrate holder 504 and a circular trajectory 502 that is to be scanned on a substrate by a fixed sensor pointed at the substrate holder 504 from above. When the substrate is placed perfectly on the substrate holder ($x_{offset}$, $y_{offset}$, $\theta_{offset}$ are all zeros), after a linear motion that places the sensor at the correct radius on the substrate, only isolated rotation of the substrate holder would allow the target scanning trajectory to be completed. FIG. 5B shows the same substrate holder 502 with a substrate 506 placed on it with exaggeratedly large offsets for illustration purposes. Circular trajectory 508 still shows the target trajectory on the substrate 506 to be scanned by the sensor. If the substrate holder 504 was to have the same motion it did for FIG. 5A, instead of scanning the target trajectory 512 shown in FIG. 5C (r=75 mm for all θ) on the substrate, it would be scanning the trajectory shown with the trajectory 510 shown in FIG. 5C, which is substantially off from the target trajectory. FIG. 5D is an illustration showing how the placement offsets can be canceled out by moving the stage linear axis in a coordinated fashion with the rotation axis. The linear axis can be moved in a way such that the sensor would be looking at what is represented with trajectory 516 on the substrate holder in FIG. 5D, causing the target circular trajectory on the substrate (as shown in FIGS. 5A-B) to be captured by the sensor. This is because the trajectory 516 is offset from the substrate holder 506 center with an amount equal to the substrate's placement offsets on the substrate holder 506 shown in FIG. 5B, but in the opposite direction.

When substrate holders 206 or 406 are rotated about the first axis by the rotational motor, any given point on the substrate holder follows a circular trajectory (assuming that there is no simultaneous linear motion). The motion system (e.g., as described with respect to FIG. 3) can compute trajectories of an arbitrary point in the second coordinate system of the substrate while sending commands to move motors and/or actuators attached to the stage. In some embodiments, the motion system can also compute trajectories of the arbitrary space by running a real-time control software (e.g., algorithm) that may be connected and sent control signals to the motion driver through the network (e.g., an EtherCAT network).

As previously described, a motion system driving the stage may be synchronized with a camera and/or a reflectometer sensor through digital trigger signals. The digital trigger signals may be transmitted via a network (e.g., such as an EtherCAT network, or other type of suitable network). The network may allow for sending the trigger signals to control the motion system at a specific rate (e.g., 1 kilo-Hertz (kHz)). The motion software may compute the corrected trajectory and transmit, in real time, the signals to the motion driver.

Additional calibrations may be performed with respect to the center (e.g., axis of rotation) of the substrate holder (equivalently, the axis of rotation of the stage) and the camera and/or the reflectometry sensor. For example, in some embodiments, the camera may be misaligned with the axis of rotation of the substrate holder and which may benefit from correction. In some embodiments, there may be an error in the mounting of the camera which would also call for correction. In either case, transformations can be applied to the camera measurements and/or sensor measurements to correct for any misalignment. These calibrations may ensure that the sensor reflectometer measurements are accurate with respect to the coordinate system (the second coordinate system) of the substrate. Although the sensor and the camera optical heads have adjustments in order to position them approximately on the center of the rotation axis, the above-described alignment algorithms can provide additional accuracy to the measurement position beyond mechanical tolerances for adjustments.

Additional calibrations may be performed for boresight correction between the reflectometry sensor and the camera. These calibrations may compute an origin of a stage of the reflectometry sensor, and apply appropriate transformations to measurements made by the camera. These calibrations ensure that the measurements taken by the reflectometry sensor are accurate and aligned with respect to the coordinates of the substrate and/or the substrate holder (e.g., depending on how the calibrations are done). The sensor reflectometer and camera optical heads may have corresponding adjustment mechanisms, but the above-described alignment and calibration algorithms can add additional accuracy to measurements.

Figure 6:
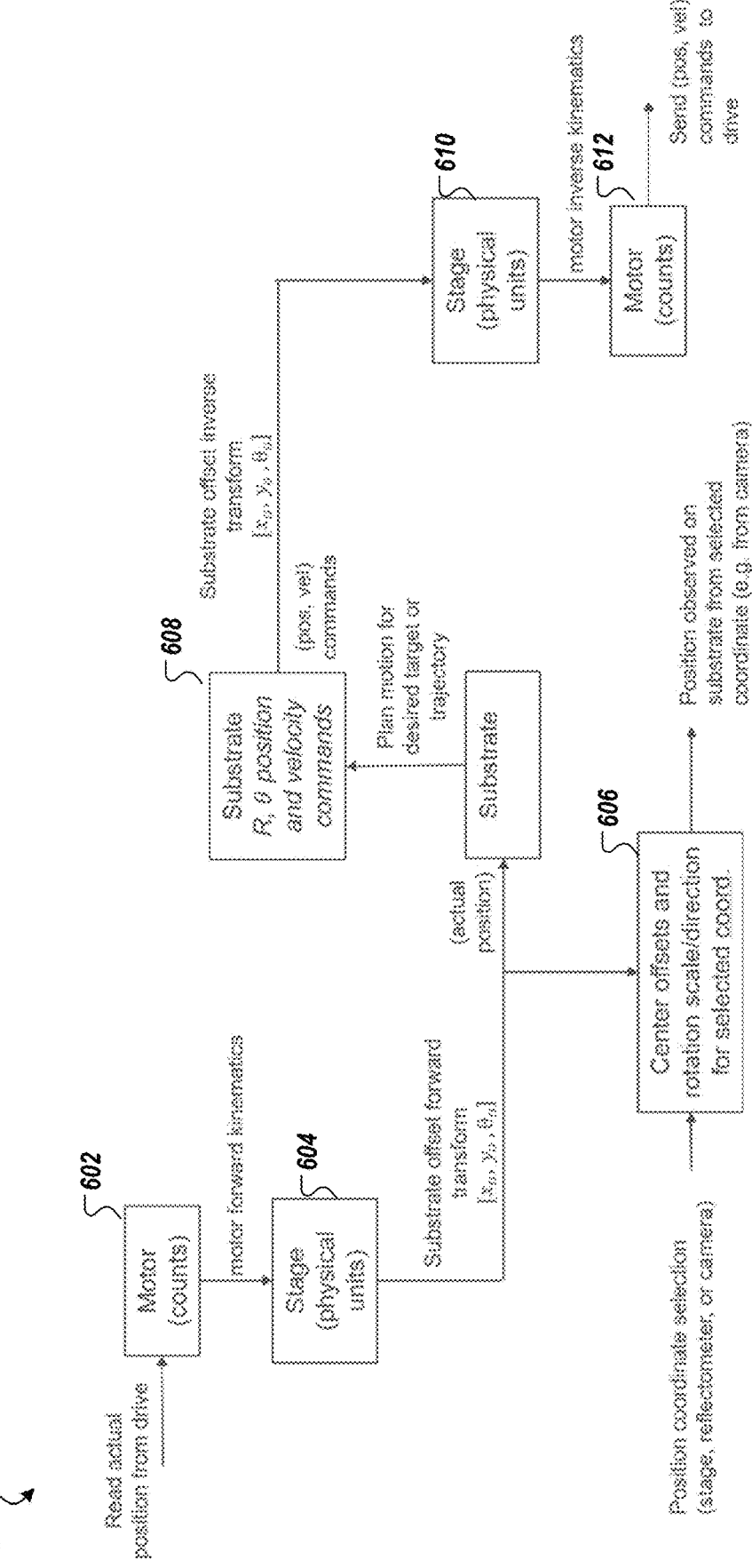
FIG. 6 is a flowchart of a method of performing coordinate transformations to correct for substrate and substrate holder offset according to one embodiment.

FIG. 6 is a flowchart of a method 600 of performing coordinate transformations to correct for substrate and substrate holder offset according to one embodiment. In some embodiments, method 600 may be performed by processing logic executed by a processor of a computing device. In some embodiments, method 600 may be performed by a processing device.

Method 600 begins by reading an actual position of a stage on which the substrate holder is fixed. The stage may be rotated about a first axis by a rotational actuator (motor) and moved along a second axis by a linear actuator, such that the stage and the substrate holder can be moved in an r-theta motion. To move the stage, the motor and/or actuator(s) may be turned by discrete amounts (counts, such as encoder counts) (e.g., the motor may be turned by steps, such as one tenth, one fifth, one third, etc. of a full rotation) (block 602). This may be determined based on commands from a drive system (a motion drive system). This motion is translated into an actual motion of the stage (block 604). For example, a given step of the motor may correspond to a movement of the stage by a certain amount (rotation by some number of degrees/radians, physical linear translation by a certain distance, etc.). A coordinate transformation may be applied to correct for the center of the substrate being offset from the center of the substrate holder. Additionally, mutual offsets between the stage, the reflectometry sensor, and the camera may be calibrated, and centered with respect to a chosen point (block 606). Processing logic may determine a target trajectory, including position and velocity, for the substrate in order for the camera and the reflectometry sensor to obtain images and measurements, respectively, of the substrate (block 608). Processing logic may apply an inverse coordinate transformation to the target trajectory in order to determine a rotational and linear motion of the stage that should be applied to replicate the desired trajectory. The inverse coordinate transformation may be representative of the actual motion of the stage (block 610). Processing logic may translate the actual motion back into motor counts (block 612). The motor counts may be sent to the drive system. The method 600 then ends.

Method 600 may be repeated for each target position of the substrate to be measured.

Figure 7:
FIG. 7 is a block diagram of a method of performing coordinate transformations to correct for substrate and substrate holder offset according to one embodiment.
Figure 7:
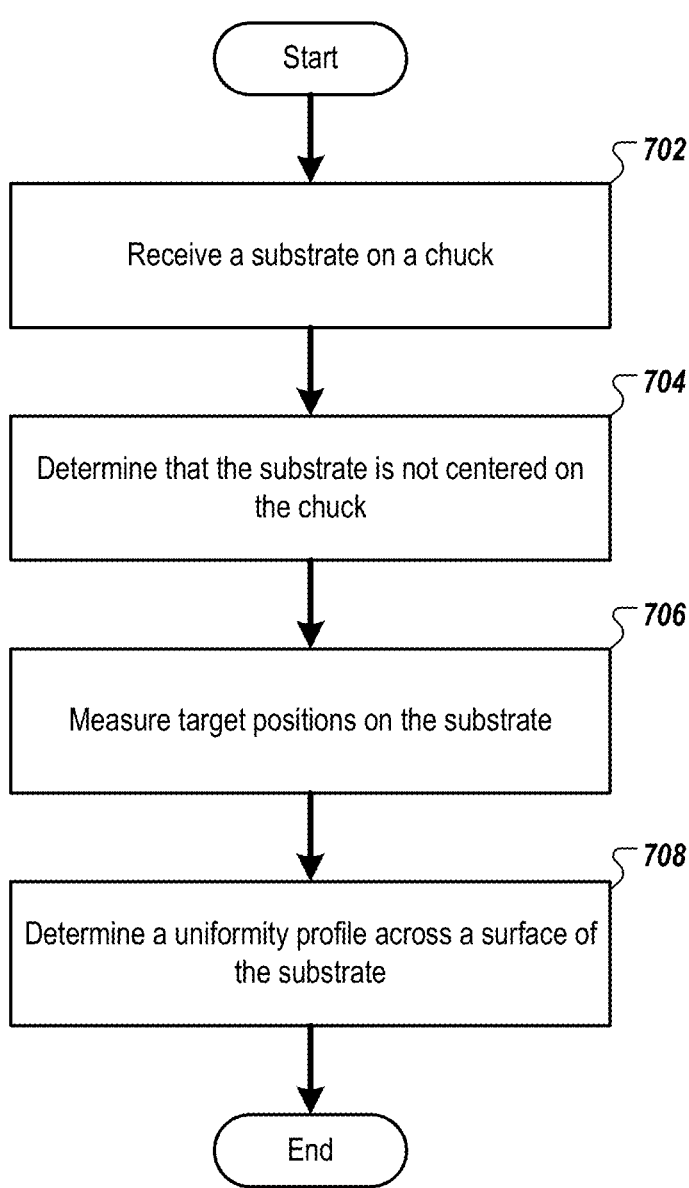

FIG. 7 is a block diagram of a method 700 of performing coordinate transformations to correct for substrate and substrate holder offset according to one embodiment. In some embodiments, method 700 may be performed by processing logic executed by a processor of a computing device. In some embodiments, method 700 may be performed by a processing device. In some embodiments, method 700 may be performed by processing system 100. In some embodiments, method 700 may be performed by measurement and/or imaging system 200 of FIG. 2A.

Method 700 begins by processing logic receiving a substrate on a substrate holder of an optical measurement device (block 702). In some embodiments, the optical measurement device may be part of processing system 100 of FIG. 1. In some embodiments, the optical measurement device may be either entirely or part of the IR system 200 of FIG. 2A. The processing logic determines that the substrate is not centered on the substrate holder (block 704) and/or a position of the substrate on the substrate holder (e.g., an offset of a center of the substrate relative to a center of the substrate holder). The amount of offsets between the substrate and the substrate holder can be designated by $[x_0, y_0, \theta_0]$. The processing logic measures one or more target positions on the substrate (block 706). The processing logic may measure the one or more target positions using a sensor. The processing logic determines a uniformity profile across a surface of the substrate based on measurements of the one or more target positions.

In some embodiments, to measure one of the one or more target positions on the substrate, the processing logic causes the substrate holder to be rotated about a first axis. The rotation of the substrate holder about the first axis causes an offset between a field of view of the sensor and the target position due to the substrate not being centered on the substrate holder. The processing logic may correct the offset by moving the substrate holder linearly along a second axis.

In some further embodiments, the processing logic determines one or more coordinate transformation between a first center of the substrate holder and a second center of the substrate. The first center of the substrate holder corresponds to the first axis about which the substrate holder rotates. The processing logic applies at least one of the one or more coordinate transformations to the substrate holder during the rotation to correct the offset.

In some further embodiments, the processing logic identifies one or more points corresponding to an edge of the substrate and performs fitting of the one or more points of the edge of a substrate to a circle. The processing logic may perform this operation to identify the (second) center of the substrate.

In some further embodiments, the processing logic uses the uniformity as input to a machine learning model. The processing logic obtains one or more outputs of the machine learning model. In some embodiments, the one or more outputs indicate a process drift of the measurement device. The method 700 ends.

Figure 8:
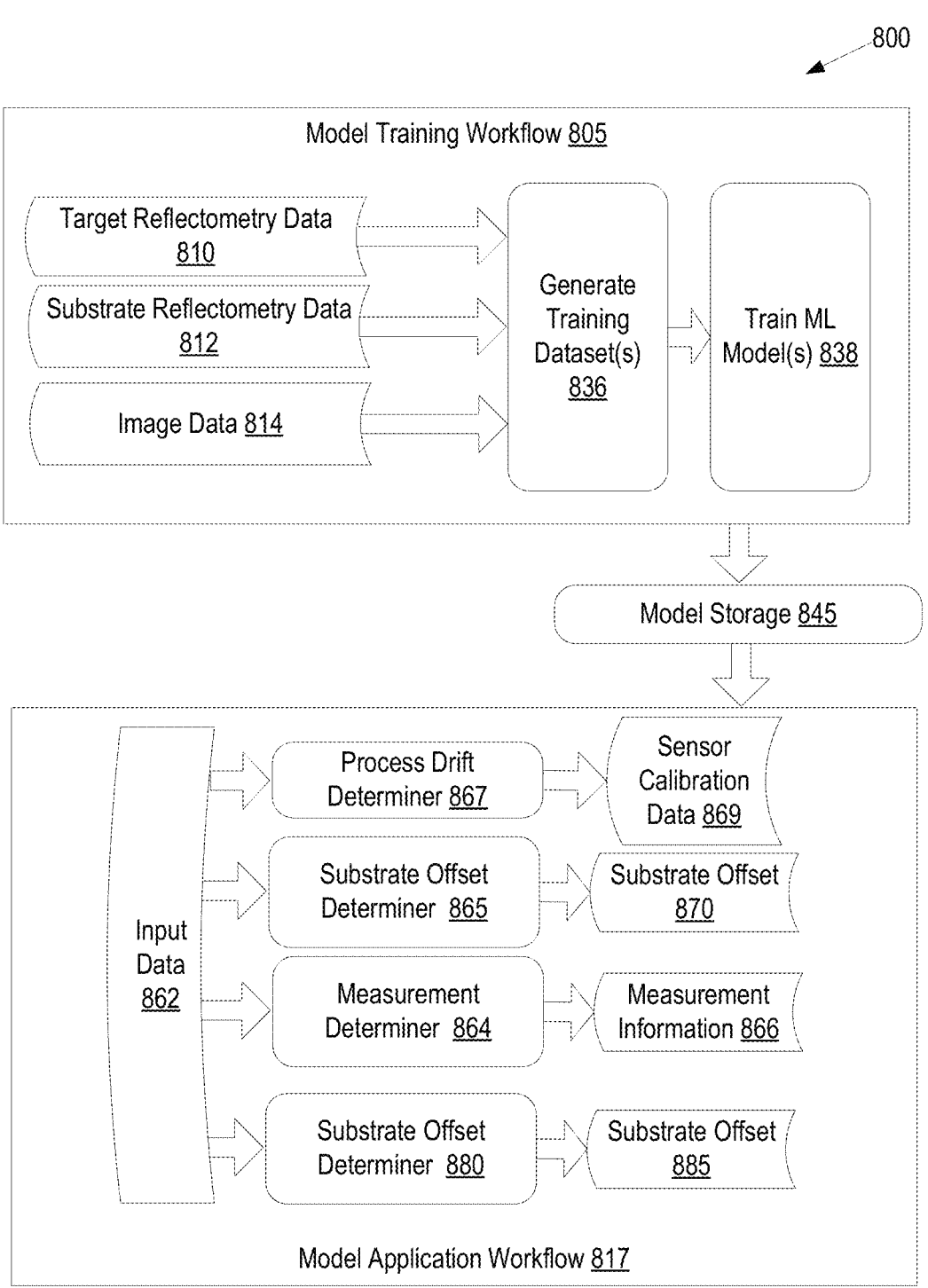
FIG. 8 illustrates a model training workflow and a model application workflow 817 for a process drift determination and a film thickness determination according to one embodiment.

FIG. 8 illustrates a model training workflow 805 and a model application workflow 817 for process drift determination, film thickness determination and/or substrate offset determination according to one embodiment. Model training workflow 805 and model application workflow 817 may be performed by processing logic executed by a processor of a computing device. One or more of these workflows 805, 817 may be implemented, for example, by one or more machine learning modules implemented on a processing device and/or other software and/or firmware executing on a processing device.

The model training workflow 805 is to train one or more machine learning models (e.g., deep learning models) to perform one or more of determining, predicting, modifying, etc. tasks associated with process drift determination (e.g., determining parameter corrections to account for process drift occurrence), film thickness determination and/or substrate offset determination (also referred to as substrate center determination), CD determination, CD-bias determination, and so on. Model application workflow 817 is to apply the one or more trained machine learning models to perform one or more of the determination tasks. One or more of the machine learning models may receive target reflectometry data 810 (e.g., of the reference target that is integrated on substrate holder 206 of FIGS. 2A-B), substrate reflectometry data 812 (or other measurement data) and/or image data 814 (or other measurement data).

Various machine learning outputs are described herein. Particular numbers and arrangements of machine learning models are described and shown. However, it should be understood that the number and type of machine learning models that are used and the arrangement of such machine learning models can be modified to achieve the same or similar end results. Accordingly, the arrangements of machine learning models that are described and shown are merely examples and should not be construed as limiting.

In embodiments, one or more machine learning models are trained to perform one or more of the below tasks. Each task may be performed by a separate machine learning model. Alternatively, a single machine learning model may perform each of the tasks or a subset of the tasks. Additionally, or alternatively, different machine learning models may be trained to perform different combinations of the tasks. In an example, one or a few machine learning models may be trained, where the trained machine learning (ML) model is a single shared neural network that has multiple shared layers and multiple higher level distinct output layers, where each of the output layers outputs a different prediction, classification, identification, etc. The tasks that the one or more trained machine learning models may be trained to perform are as follows:

a. Process drift determination—As a substrate is being processed in a processing chamber, a number of variables may change or drift as a function of time. For example, there may be temperature fluctuations, deposition/etch rate fluctuations, etc. that may affect the uniformity of the film thickness (e.g., uniformity profile) across the surface substrate that is being processed. Additionally, chemical build-up which may happen over longer time scales may affect the uniformity profile across the surface of the substrate. The model would receive target reflectometry data and determine parameters that should be adjusted for calibration of the sensor for reflectometry measurements.

b. Film thickness determination—In some embodiments, it is desirable to have a film thickness across the surface of the substrate which is as uniform as possible. In order to efficiently measure the uniformity profile of the substrate, the sensor measures a number of target positions on the substrate. The number of positions and the location of positions needs to be optimally determined to gain an accurate representation of the uniformity profile. A machine learning model may receive measurements of one or more target positions and determine that the number and location of the one or more target positions is sufficient to give an accurate representation of the uniformity profile.

c. Measurement determination—A sensor measures a number of target positions on the substrate. The number of positions and the location of positions may be measured to determine optical constants, roughness, film thickness, material properties, particles, and so on. A machine learning model may receive measurements of one or more target positions and determine that the number and location of the one or more target positions is sufficient to give an accurate representation of a uniformity profile.

d. Substrate offset/center determination of substrate in IR system—One or more images may be generated by the camera while the substrate holder has one or more r, theta coordinate settings. These images and/or the r, theta coordinate settings of the substrate holder may be input into a trained ML model that outputs an indication of a center of the substrate. The ML model may output an offset of the substrate center relative to the substrate holder center (e.g., an x, y offset, or an r, theta offset) and/or a translation function for translating between a substrate-centered r, theta coordinate system and a substrate holder-centered r, theta coordinate system.

e. Substrate offset determination of substrate in process chamber—Sensor inferred data such as film thickness, CD, etc. at multiple target locations on a substrate can be used to generate a substrate map (e.g., wafer map). Data from the substrate map may be input into a trained ML model that outputs an inference of offset of placement of the substrate in a process chamber in which the substrate was previously processed.

One type of machine learning model that may be used to perform some or all of the above tasks is an artificial neural network, such as a deep neural network. Artificial neural networks generally include a feature representation component with a classifier or regression layers that map features to a desired output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). Deep learning is a class of machine learning algorithms that use a cascade of multiple layers of nonlinear processing units for feature extraction and transformation. Each successive layer uses the output from the previous layer as input. Deep neural networks may learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. Notably, a deep learning process can learn which features to optimally place in which level on its own. The "deep" in "deep learning" refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs may be that of the network and may be the number of hidden layers plus one. For recurrent neural networks, in which a signal may propagate through a layer more than once, the CAP depth is potentially unlimited.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and back-propagation to tune the weights of the network across all its layers and nodes such that the error is minimized. In many applications, repeating this process across the many labeled inputs in the training dataset yields a network that can produce correct output when presented with inputs that are different than the ones present in the training dataset.

For model training workflow 805, a training dataset containing hundreds, thousands, tens of thousands, hundreds of thousands or more target reflectometry data 810 (e.g., determination of uniformity profiles at different points in time using different numbers and locations of target positions on substrates given a particular set of process conditions), substrate reflectometry data 812 (e.g., one or more thickness profiles obtained by taking different numbers and/or locations of target positions of the substrate), and/or image data 814 of a substrate on a substrate holder (optionally accompanied by position coordinates such as a linear position and a rotational position of the substrate holder) should be used to form a training dataset. Data may include, for example, a uniformity profile determined using a given number of measurements each associated with a particular target position. This data may be processed to generate one or more training datasets 836 for the training of one or more machine learning models. The machine learning models may be trained, for example, to automatically calibrate the sensor between and/or during measurements of the substrate, and/or to automatically correct for process variations (such as changing conditions in the processing chamber, substrate placement that is offset from the center of the substrate holder, etc.) that may affect the measurement of the uniformity profile of the substrate, and/or to determine an offset of a substrate center relative to a substrate holder center.

In one embodiment, generating one or more training datasets 836 includes gathering one or more target substrate reflectometry data and/or gathering one or more images of substrates on substrate holders with different offsets, orientations and/or substrate holder orientations/positions. The labels that are used may depend on what a particular machine learning model will be trained to do. For example, to train a machine learning model to perform process drift determination, a training dataset 836 may include data labels indicative of reflectometry measurements of the reference target over time. To train an ML model to determine a center offset (e.g., determine a center of a substrate) labels may include offsets between a substrate center and a substrate holder center. As described in other embodiments the process recipes and/or process results may be represented as vectors and the process rates may be represented as one or more matrices.

To effectuate training, processing logic inputs the training dataset(s) 836 into one or more untrained machine learning models. Prior to inputting a first input into a machine learning model, the machine learning model may be initialized. Processing logic trains the untrained machine learning model(s) based on the training dataset(s) to generate one or more trained machine learning models that perform various operations as set forth above. Training may be performed by inputting one or more of target reflectometry data 810 and substrate reflectometry data 812 into the machine learning one at a time.

The machine learning model processes the input to generate an output. An artificial neural network includes an input layer that consists of values in a data point. The next layer is called a hidden layer, and nodes at the hidden layer each receive one or more of the input values. Each node contains parameters (e.g., weights) to apply to the input values. Each node therefore essentially inputs the input values into a multivariate function (e.g., a non-linear mathematical transformation) to produce an output value. A next layer may be another hidden layer or an output layer. In either case, the nodes at the next layer receive the output values from the nodes at the previous layer, and each node applies weights to those values and then generates its own output value. This may be performed at each layer. A final layer is the output layer, where there is one node for each class, prediction and/or output that the machine learning model can produce.

Accordingly, the output may include one or more predictions or inferences. For example, an output prediction or inference may include one or more modifications to substrate reflectometry data (e.g., modifications based on calibration of the sensor). Processing logic may cause a substrate to be processed using the updated recipe (e.g., with the identified modifications) and receive an updated thickness profile. Processing logic may compare the updated thickness profile against a target thickness profile and determine whether a threshold criterion is met (e.g., thickness values measured across a surface of the wafer fall within a target threshold value window). Processing logic determines an error (i.e., a classification error) based on the differences between the updated thickness profile and the target thickness profile. Processing logic adjusts weights of one or more nodes in the machine learning model based on the error. An error term or delta may be determined for each node in the artificial neural network. Based on this error, the artificial neural network adjusts one or more of its parameters for one or more of its nodes (the weights for one or more inputs of a node). Parameters may be updated in a back propagation manner, such that nodes at a highest layer are updated first, followed by nodes at a next layer, and so on. An artificial neural network contains multiple layers of "neurons", where each layer receives as input values from neurons at a previous layer. The parameters for each neuron include weights associated with the values that are received from each of the neurons at a previous layer. Accordingly, adjusting the parameters may include adjusting the weights assigned to each of the inputs for one or more neurons at one or more layers in the artificial neural network.

Once the model parameters have been optimized, model validation may be performed to determine whether the model has improved and to determine a current accuracy of the deep learning model. After one or more rounds of training, processing logic may determine whether a stopping criterion has been met. A stopping criterion may be a target level of accuracy, a target number of processed images from the training dataset, a target amount of change to parameters over one or more previous data points, a combination thereof and/or other criteria. In one embodiment, the stopping criteria is met when at least a minimum number of data points have been processed and at least a threshold accuracy is achieved. The threshold accuracy may be, for example, 70%, 80% or 90% accuracy. In one embodiment, the stopping criterion is met if accuracy of the machine learning model has stopped improving. If the stopping criterion has not been met, further training is performed. If the stopping criterion has been met, training may be complete. Once the machine learning model is trained, a reserved portion of the training dataset may be used to test the model.

As an example, a machine learning model (e.g., process drift determiner 867) is trained to determine changes in process parameters over time. A similar process may be performed to train machine learning models to perform other tasks such as those set forth above. A set of many (e.g., hundreds to millions) target reflectometry data may be collected and sensor calibration data 869 may be determined.

Once one or more trained machine learning models 838 are generated, they may be stored in model storage 845, and may be added to process drift determiner 867, measurement determiner 864, substrate offset determiner 880, and/or offset determiner 865. Process drift determiner 867, measurement determiner 864, substrate offset determiner 880, and/or offset determiner 865 may then use the one or more trained machine learning models 838 as well as additional processing logic.

For model application workflow 817, according to one embodiment, input data 862 may be input into process drift determiner 867, which may include a trained neural network. Based on input data 862, process drift determiner 867 outputs information indicated of parameters that may need to be tuned to calibrate the sensor.

According to one embodiment, input data 862 may include one or more images of a substrate on a substrate holder. The input data 862 may further include a position and orientation of the substrate holder (e.g., as r, theta coordinates in a substrate holder-centered coordinate system). In one embodiment, the position and orientation is provided as a linear position (e.g., from a linear encoder associated with a linear actuator) and as a rotational position (e.g., from a rotational encoder associated with a rotational actuator). The input data 862 may be input into substrate offset determiner 865, which may output a center of the substrate. In one embodiment, the offset determiner 865 outputs a substrate offset 870 that indicates an offset between a center of the substrate holder and a center of the substrate. Based on the substrate offset 870, a controller may determine coordinate transformations for transforming between a substrate holder-centered coordinate system and a substrate-centered coordinate system. These transformations may be used to determine how to move a linear actuator during rotation of a substrate holder to ensure that a points at a target radius remain beneath a sensor during measurements of points at the radius on the substrate.

According to one embodiment, input data 862 may be input into a measurement determiner 864 (which may be a film thickness determiner, a CD deviation determiner, a particular count determiner, an optical constant determiner, etc.), which may include a trained neural network. In some embodiments, sensor calibration data 869 may be input into measurement determiner 864. Based on input data 862, measurement determiner 864 may generate one or more outputs related to critical dimensions, film thickness, optical constants, particle count, etc. referred to as measurement information 8866. In one embodiment, measurement information 866 output by measurement determiner 864 includes a map of measurement values across the substrate. In one embodiment, measurement information 866 output by measurement determiner 866 includes a map of measurements (e.g., deviations of CD from a specification over a surface of a substrate, CD-bias values, film thickness, etc.).

According to one embodiment, input data 862 may be input into substrate offset determiner 880, which may include a trained neural network. In some embodiments, sensor calibration data 869 may be input into substrate offset determiner 880. Based on input data 862, substrate offset determiner 880 may generate an output that indicates an offset that a previously processed substrate had while the substrate was in a process chamber that had processed the substrate. This information may be used to determine if a robot arm is placing substrates incorrectly in a process chamber, if lift pins are misaligned in a process chamber, and so on.

FIG. 9 depicts a block diagram of an example computing device capable of process drift and film thickness determination, operating in accordance with one or more aspects of the disclosure. In various illustrative examples, various components of the computing device 900 may represent various components of a computing device, controller, and/or control panel (e.g., analogous elements described in association with FIGS. 1-3).

Example computing device 900 may be connected to other computer devices in a local area network (LAN), an intranet, an extranet, and/or the Internet. Computing device 900 may operate in the capacity of a server in a client-server network environment. Computing device 900 may be a personal computer (PC), a set-top box (STB), a server, a network router, switch or bridge, or any device capable of executing a set of instructions (sequential or otherwise) that specify actions to be taken by that device. Further, while only a single example computing device is illustrated, the term "computer" shall also be taken to include any collection of computers that individually or jointly execute a set (or multiple sets) of instructions to perform any one or more of the methods discussed herein.

Example computing device 900 may include a processing device 902 (also referred to as a processor or CPU), a main memory 904 (e.g., read-only memory (ROM), flash memory, dynamic random access memory (DRAM) such as synchronous DRAM (SDRAM), etc.), a static memory 906 (e.g., flash memory, static random access memory (SRAM), etc.), and a secondary memory (e.g., a data storage device 918), which may communicate with each other via a bus 930.

Processing device 902 represents one or more general-purpose processing devices such as a microprocessor, central processing unit, or the like. More particularly, processing device 902 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. In accordance with one or more aspects of the disclosure, processing device 902 may be configured to execute instructions implementing methods 600-800 illustrated in FIGS. 6-8.

Example computing device 900 may further comprise a network interface device 908, which may be communicatively coupled to a network 920. Example computing device 900 may further comprise a video display 910 (e.g., a liquid crystal display (LCD), a touch screen, or a cathode ray tube (CRT)), an alphanumeric input device 912 (e.g., a keyboard), a cursor control device 914 (e.g., a mouse), and an acoustic signal generation device 916 (e.g., a speaker).

Data storage device 918 may include a machine-readable storage medium (or, more specifically, a non-transitory machine-readable storage medium) 928 on which is stored one or more sets of executable instructions 922. In accordance with one or more aspects of the disclosure, executable instructions 922 may comprise executable instructions associated with executing methods 600-800 illustrated in FIGS. 6-8.

Executable instructions 922 may also reside, completely or at least partially, within main memory 904 and/or within processing device 902 during execution thereof by example computing device 900, main memory 904 and processing device 902 also constituting computer-readable storage media. Executable instructions 922 may further be transmitted or received over a network via network interface device 908.

While the computer-readable storage medium 928 is shown in FIG. 9 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "identifying," "determining," "storing," "adjusting," "causing," "receiving," "comparing," "measuring," "correcting," "applying," "using," "obtaining," "replacing," "performing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the disclosure also relate to an apparatus for performing the methods described herein. This apparatus may be specially constructed for the target purposes, or it may be a general purpose computer system selectively programmed by a computer program stored in the computer system. Such a computer program may be stored in a computer readable storage medium, such as, but not limited to, any type of disk including optical disks, compact disc read only memory (CD-ROMs), and magnetic-optical disks, read-only memories (ROMs), random access memories (RAMs), erasable programmable read-only memory (EPROMs), electrically erasable programmable read-only memory (EEPROMs), magnetic disk storage media, optical storage media, flash memory devices, other type of machine-accessible storage media, or any type of media suitable for storing electronic instructions, each coupled to a computer system bus.

The methods and displays presented herein are not inherently related to any particular computer or other apparatus. Various general purpose systems may be used with programs in accordance with the teachings herein, or it may prove convenient to construct a more specialized apparatus to perform the method steps. The structure for a variety of these systems will appear as set forth in the description below. In addition, the scope of the disclosure is not limited to any particular programming language. It will be appreciated that a variety of programming languages may be used to implement the teachings of the disclosure.

The preceding description sets forth numerous specific details such as examples of specific systems, components, methods, and so forth, in order to provide a good understanding of several embodiments of the disclosure. It will be apparent to one skilled in the art, however, that at least some embodiments of the disclosure may be practiced without these specific details. In other instances, well-known components or methods are not described in detail or are presented in simple block diagram format in order to avoid unnecessarily obscuring the disclosure. Thus, the specific details set forth are merely exemplary. Particular implementations may vary from these exemplary details and still be contemplated to be within the scope of the disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A system comprising:
a transfer chamber comprising a first robot arm;
a process chamber connected to the transfer chamber;
a load lock connected to the transfer chamber;
a factory interface connected to the load lock, the factory interface comprising a second robot arm; and
an optical measurement device, wherein the first robot arm or the second robot arm is to move a substrate to the optical measurement device, and wherein the optical measurement device comprises:
   a substrate holder to secure the substrate;
   a plurality of actuators to move the substrate holder relative to a plurality of axes;
   a first sensor to generate one or more first measurements or images of a first plurality of target positions on the substrate;
   a second sensor to generate one or more second measurements of a second plurality of target positions on the substrate;
   a plate, wherein the substrate holder, the plurality of actuators, the first sensor and the second sensor are each mounted to the plate, and wherein the plate provides vibration isolation from the factory interface; and
   a processing device that executes instructions to control the plurality of actuators and process the one or more first measurements or images and the one or more second measurements.

2. The system of claim 1, wherein the processing device is further to:
cause a first actuator of the plurality of actuators to rotate the substrate holder about a first axis for measurement of a target position of the second plurality of target positions, wherein the rotation causes an offset between a field of view of the second sensor and the target position on the substrate due to the substrate not being centered on the substrate holder;
cause a second actuator of the plurality of actuators to move the substrate holder linearly along a second axis to correct the offset; and
determine a profile across a surface of the substrate based on the one or more second measurements of the second plurality of target positions.

3. The system of claim 2, wherein the processing device is further to:
determine one or more coordinate transformations between a center of the substrate holder that corresponds to the first axis about which the substrate holder rotates and a center of the substrate; and
apply the one or more coordinate transformations during a rotation of the substrate holder about the first axis to correct an offset between the center of the substrate holder and the center of the substrate.

4. The system of claim 1, wherein the processing device is an integrated component of the optical measurement device that executes software and that is connected to the plurality of actuators.

5. The system of claim 4, wherein the software comprises real-time control software configured to send control signals to motion drivers of the plurality of actuators through a network.

6. The system of claim 1, wherein the processing device is configured to determine an edge of the substrate secured on the substrate holder based on the one or more first measurements or images.

7. The system of claim 1, wherein the plurality of actuators are configured to move the substrate holder according to an r-theta motion.

8. The system of claim 1, further comprising:

an integrated reference target having a fixed position on the substrate holder and a known property.

9. The system of claim 8, wherein the processing device is configured to determine a relationship between a first coordinate system of the first sensor or camera and a second coordinate system of the second sensor based on a first position of the substrate holder at which spectral reflections are captured by the first sensor or camera and a second position of the substrate holder at which spectral reflections are captured by the second sensor.

10. The system of claim 8, wherein the processing device is configured to calibrate the optical measurement device based on a difference between a measured property of the integrated reference target as measured by the second sensor and the known property of the integrated reference target.

11. The system of claim 1, wherein the one or more second measurements comprise measurements of at least one of critical dimensions (CDs), CD-bias, particle count, optical constant, or film thickness, and wherein the second sensor comprises a reflectometry sensor.

12. The system of claim 1, wherein the optical measurement device is configured to process up to about 100 substrates per hour.

13. The system of claim 1, wherein the processing device is configured to generate a map of the substrate based on at least one of the one or more first measurements or the one or more second measurements.

14. The system of claim 1, wherein the optical measurement device has a first outer dimension of about 14-20 inches, a second outer dimension of about 20-28 inches, and a third outer dimension of about 22-28 inches.

15. The system of claim 1, wherein the optical measurement device is mounted to the factory interface.

16. The system of claim 1, wherein the optical measurement device is mounted to the transfer chamber.

\* \* \* \* \*